United States Patent
Kiba et al.

(10) Patent No.: US 11,639,783 B2
(45) Date of Patent: May 2, 2023

(54) LIGHT SOURCE DEVICE AND LENS STRUCTURE

(71) Applicant: NICHIA CORPORATION, Anan (JP)

(72) Inventors: Daizo Kiba, Itano-gun (JP); Takashi Matsuda, Komatsushima (JP); Tsuyoshi Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/520,865

(22) Filed: Nov. 8, 2021

(65) Prior Publication Data
US 2022/0146074 A1 May 12, 2022

(30) Foreign Application Priority Data

Nov. 9, 2020 (JP) .............................. JP2020-186519
May 19, 2021 (JP) .............................. JP2021-084692

(51) Int. Cl.
*F21V 5/04* (2006.01)
*F21V 17/08* (2006.01)
*F21V 13/04* (2006.01)

(52) U.S. Cl.
CPC .............. *F21V 5/043* (2013.01); *F21V 17/08* (2013.01); *F21V 13/04* (2013.01)

(58) Field of Classification Search
CPC .......... F21V 11/00; F21V 13/02; F21V 13/04; F21V 17/08; F21V 5/04; F21V 5/043; F21Y 2105/16; F21Y 2115/10; G02B 7/02; G02B 19/0066; H01L 25/0753; H01L 33/502; H01L 33/58
See application file for complete search history.

(56) References Cited

U.S. PATENT DOCUMENTS

| | | | |
|---|---|---|---|
| 6,142,657 A * | 11/2000 | Hinich | B60Q 1/068 362/539 |
| 8,033,687 B2 * | 10/2011 | Wang | F21V 31/005 362/267 |
| 2010/0328960 A1 * | 12/2010 | Wang | F21V 29/51 362/373 |
| 2011/0157905 A1 * | 6/2011 | Chang | F21S 41/27 362/475 |

(Continued)

FOREIGN PATENT DOCUMENTS

| | | |
|---|---|---|
| JP | H05-077272 A | 3/1993 |
| JP | 2010-089398 A | 4/2010 |

(Continued)

*Primary Examiner* — Zheng Song
(74) *Attorney, Agent, or Firm* — Foley & Lardner LLP

(57) ABSTRACT

A light source device includes: a light source having an upper surface including a light-emitting surface, the light source comprising a plurality of light-emitting parts arranged in a two-dimensional array; a lens located above and spaced apart from the light-emitting surface of the light source, wherein the lens comprises an optically functional part, and a flange part located along an outer periphery of the optically functional part; and a support part formed of a light-shielding material and configured to support at least the flange part of the lens. A surface area of a first surface of the optically functional part is greater than a surface area of a second surface of the optically functional part. The flange part defines at least one first recess in a surface located at a same side as the second surface.

25 Claims, 16 Drawing Sheets

(56) References Cited

U.S. PATENT DOCUMENTS

| | | | |
|---|---|---|---|
| 2013/0175720 A1 | 7/2013 | Otsuka et al. | |
| 2013/0201693 A1* | 8/2013 | Tang | F21V 5/048 |
| | | | 362/335 |
| 2014/0049967 A1* | 2/2014 | Zhou | F21K 9/23 |
| | | | 362/287 |
| 2017/0097138 A1* | 4/2017 | Di Giovine | F21V 17/12 |
| 2018/0045399 A1* | 2/2018 | Chen | F21V 29/773 |
| 2019/0154223 A1* | 5/2019 | Mizutani | B29D 11/00865 |
| 2019/0323665 A1* | 10/2019 | Okahisa | G03B 15/05 |
| 2021/0180754 A1* | 6/2021 | van der Sijde | F21V 23/0492 |

FOREIGN PATENT DOCUMENTS

| | | |
|---|---|---|
| JP | 2012-051291 A | 3/2012 |
| JP | 2013-202810 A | 10/2013 |
| JP | 2019-093564 A | 6/2019 |
| JP | 2020-078923 A | 5/2020 |
| JP | 2020-098284 A | 6/2020 |
| WO | WO-2012/029523 A1 | 3/2012 |

* cited by examiner

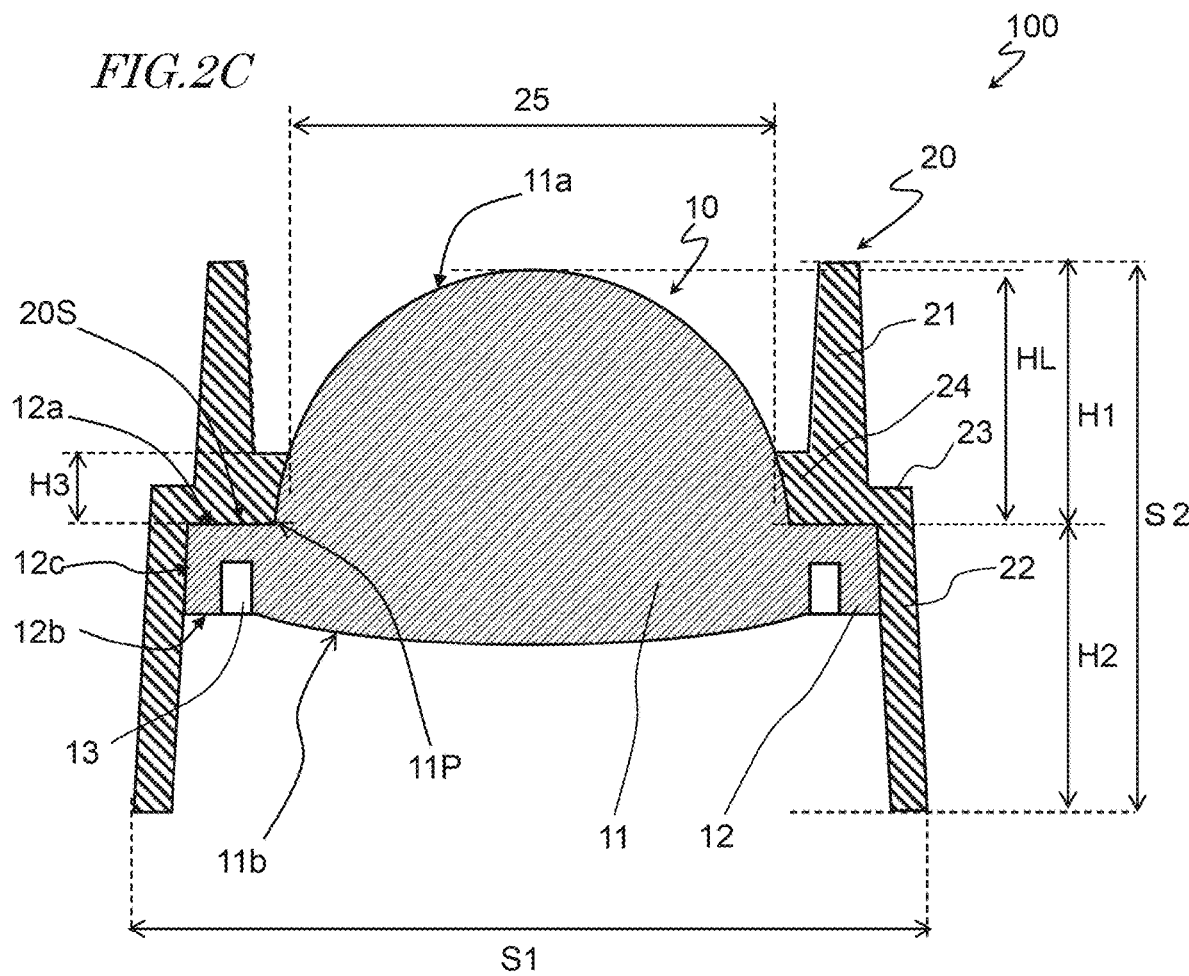

LIGHT SOURCE DEVICE AND LENS STRUCTURE

CROSS-REFERENCE TO RELATED PATENT APPLICATIONS

The present application claims priority under 35 U.S.C. § 119 to Japanese Patent Application No. 2020-186519, filed on Nov. 9, 2020, and Japanese Patent Application No. 2021-084692, filed on May 19, 2021, the contents of which are hereby incorporated by reference in their entireties.

BACKGROUND

The present disclosure relates to a light source device and a lens structure.

There have been disclosed a composite lens having a compression-molded lens part and a frame part surrounding the lens part that are solidly joined by injection molding.

SUMMARY

A mold for such a composite lens includes an upper mold and a lower mold, each of the upper mold and the lower mold includes a core for a lens portion, a core for a flange portion, and a core for a frame portion. Although each of the core portions can be moved independently in a method of manufacturing a composite lens, many steps are required in manufacturing composite lenses (for example, refer to JP 2013-202810 A).

An object of the present disclosure is to provide a light source device and a lens structure having good adhesion between a support part and a lens.

A light source device according to one embodiment of the present disclosure includes a light source having an upper surface including a light-emitting surface, the light source comprising a plurality of light-emitting parts arranged in a two-dimensional array; a lens located above and spaced apart from the light-emitting surface of the light source, the lens including an optically functional part and a flange part located along an outer periphery of the optically functional part; and a support part formed of a light-shielding material, the support part configured to support at least the flange part of the lens. The optically functional part includes a first surface and a second surface, the first surface being located at opposite side from the light source and the second surface being located at an opposite side from the first surface and facing the light source. The first surface has a surface area greater than a surface area of the second surface, and the first surface and the second surface each covers the plurality of light-emitting parts in a plan view. The flange part includes a third surface and a fourth surface, the third surface being located at a same side of the first surface and the fourth surface being located at the same side of the second surface. The flange part is formed with at least one first recess in the fourth surface.

A lens structure according to one embodiment of the present disclosure includes a lens including an optically functional part and a flange part located along an outer periphery of the optically functional part; and a support part formed of a light-shielding material and configured to support at least the flange part of the lens. The lens and the support part are molded in one body through double-shot molding, the optical functional part includes a first surface and a second surface located on a side opposite from the first surface, the first surface has a surface area greater than a surface area of the second surface, the flange part has a third surface located on a same side as the first surface, and a fourth surface located on a same side as the second surface, and the flange part defines at least one first recess in the fourth surface.

According to certain embodiments of the present disclosure, a light source device and a lens structure having good adhesion between a support part and a lens can be provided.

BRIEF DESCRIPTION OF THE DRAWINGS

FIG. 2C is a schematic cross-sectional view taken along line 2C-2C of FIG. 2A and FIG. 2B.

DETAILED DESCRIPTION

Figure 1A:
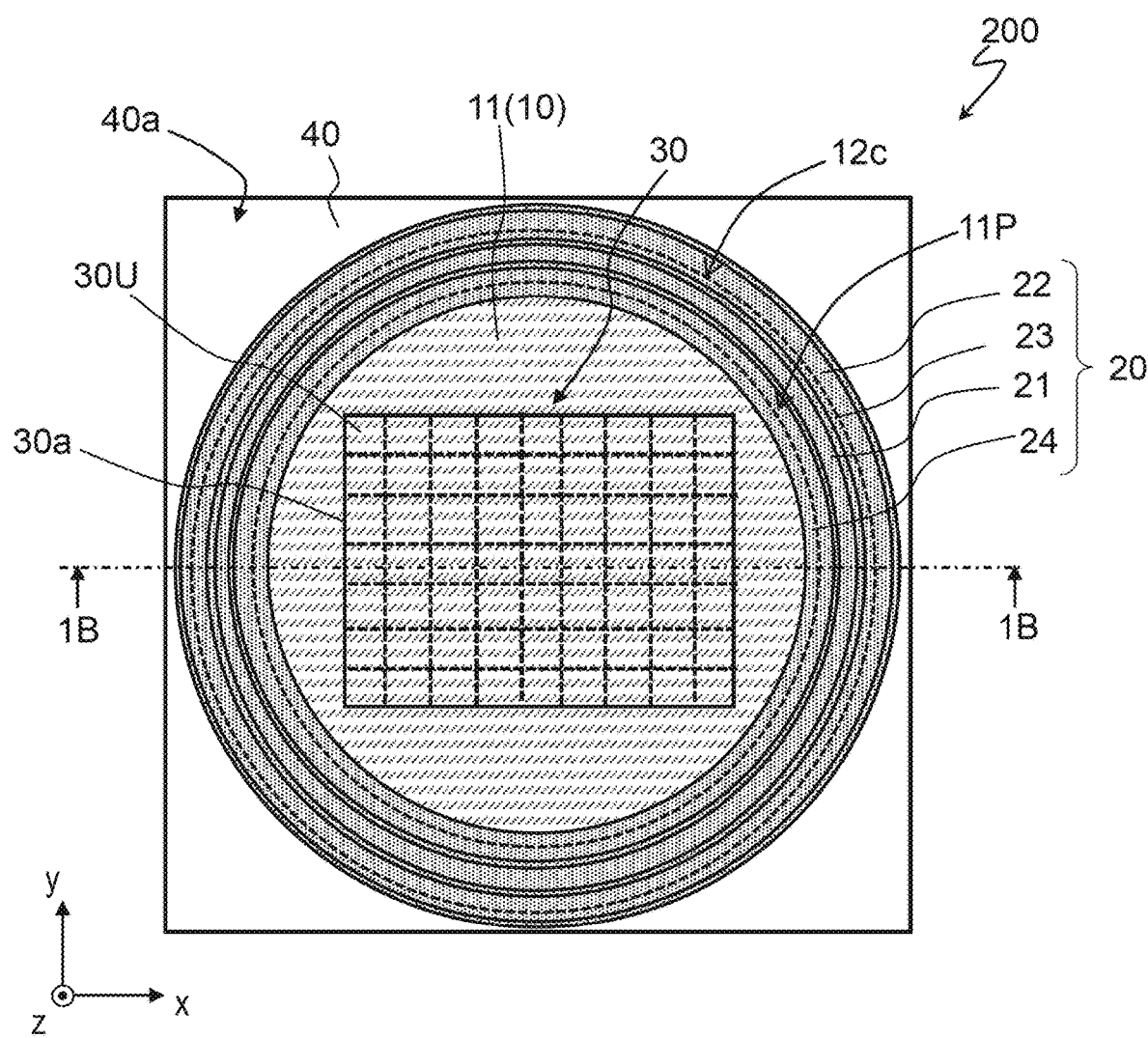
FIG. 1A is a schematic top view showing a light source device according to certain embodiments of the present disclosure.

Certain embodiments of the present invention will be described below with reference to the accompanying drawings. It is to be noted that the light source device described below is intended for implementing the technical concepts of the present invention, and the present invention is not limited to the described embodiments below unless otherwise specified. Description given in one embodiment can also be applied in other embodiments and variational examples. The sizes or positional relationships of the members shown in the drawings are occasionally shown exaggerated for the sake of clarity.

In the description below, the same designations or the same reference numerals denote the members having functions substantially the same and description thereof may be appropriately omitted. Components that are not referenced in the description may not be marked with a reference character. In the description below, terms that indicate specific directions or locations (for example, "up," "down," "right," "left," and other terms expressing such directions or locations) may be applied. Those terms are used to express relative directional relationship and positional relationship between the components in a drawing that is referred to for the ease of understanding. In the present specification, terms such as "upper" and "lower" are used to illustrate a relative locational relationship between the components in a drawing that is referred to, and unless specifically indicated, are not intended to show an absolute positional relationship. In the present specification, the term "parallel" indicates that the angle formed between two straight lines, two sides, two surfaces, etc., is in a range of about 0°+/−5°, unless otherwise indicated. In addition, the term "perpendicular" or "orthogonal" indicates that the angle formed between two straight lines, two sides, two surfaces, etc., is in a range of about 90°+/−5°.

In certain drawings shown below, x-axis, y-axis, and z-axis orthogonal to one another are indicated. The x direction along the x-axis indicates a predetermined direction in an arrangement plane where the light source of the light source device according to one embodiment is arranged (in other words, in an arrangement plane where the light-emitting parts are arranged). The y direction along the y-axis indicates a direction orthogonal to the x direction in the light source arrangement plane. The z direction along the z-axis indicates the direction orthogonal to the arrangement plane. In the x direction, the direction in which the arrow is pointing is represented as the +x direction and the direction opposite to the +x direction is represented as the −x direction. In the y direction, the direction in which the arrow is pointing is represented as the +y direction and the direction opposite to the +y direction is represented as the −y direction. In the z direction, the direction in which the arrow is pointing is represented as the +z direction and the direction opposite to the +z direction is represented as the −z direction. In the present embodiment, the light source is adapted to emit light in the +z direction, for example. However, this does not limit the orientation of the light source device and the lens structure when used, and the orientation of the light source device and of the lens structure can be appropriately determined.

Hereinafter, example embodiments will be described illustrating a flashlight for smartphone that includes a light source device and a lens structure according to the embodiments.

Embodiments

Figure 1B:
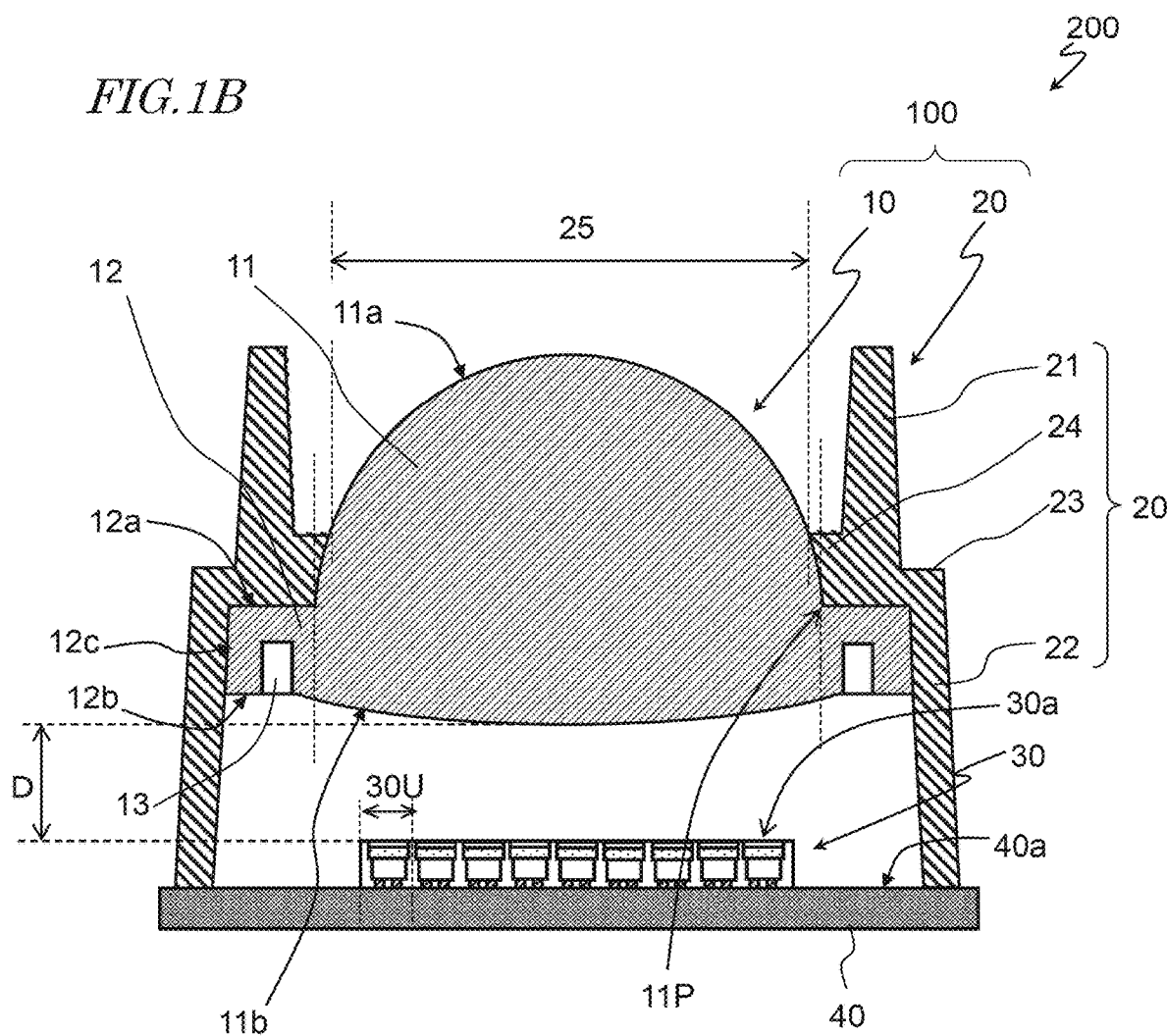
FIG. 1B is a schematic cross-sectional view taken along line 1B-1B of FIG. 1A.

FIG. 1A and FIG. 1B are diagrams illustrating a light source device 200 according to a first embodiment of the present disclosure. FIG. 1A is a schematic top view showing a light source device 200. FIG. 1B is a schematic cross-sectional view of the light source device 200, taken along line 1B-1B of FIG. 1A.

The light source device 200 includes a light source 30, a lens 10, and a support part 20.

The light source 30 includes a plurality of light-emitting parts 30U arranged in a two dimensional array. The lens 10 is arranged above a light-emitting surface 30a of the light source 30 (in the +z direction), spaced apart from the light source 30. The lens 10 includes an optically functional part 11 and a flange part 12 arranged along the outer periphery 11P of the optically functional part 11. The support part 20 is formed of a light-shielding material and is configured to support at least the flange part 12 of the lens 10. In the present specification, a structure including the lens 10 and the support part 20 is referred to as a "lens structure."

The optically functional part 11 includes a first surface 11a located on an opposite side from the light source 30, and a second surface 11b located on an opposite side from the first surface 11a and facing the light source 30. The first surface 11a and the second surface 11b each covers the plurality of light-emitting parts 30U in a plan view. A surface area of the first surface 11a is greater than a surface area of the second surface 11b.

The flange part 12 has a third surface 12a located on the same side as the first surface 11a, and a fourth surface 12b, located on the same side as the second surface 11b. The flange part 12 is formed with at least one first recess 13 in the fourth surface 12b.

In the present embodiment, the lens 10 is formed using a light-transmissive material. The support part 20 can be formed of a light-shielding resin member. In order to mold different materials such as the lens 10 and the support part 20 into a single piece, a double-shot molding method described below can be employed. Through a double-shot molding method, the lens 10 and the support part 20 can be molded into a single piece without using an adhesive, even when the lens 10 is molded prior to molding the support part 20. Note that the base material of the lens 10 and the base material of the support part 20 can be the same or different, and further, can contain different substances. According to the present embodiment, forming the at least one first recess 13 in the fourth surface 12b of the flange part 12 of the lens 10 can improve the adhesion between the lens 10 and a mold (lower mold) at a lower surface side of the lens 10, when a primary molded lens 10 is formed in a double-shot molding process described below. As a result, after the lens 10 is molded and the mold is opened, the lens 10 can be separated from a mold (upper mold) on an upper surface side of the lens 10 while the lens 10 remains in the lower mold. It is therefore possible to form the support part 20 as a secondary molded article in succession after molding the lens 10.

In the present embodiment, the at least one first recess 13 is formed in the flange part 12, which is located outside the optically functional part 11. This will reduce the effect of the at least one first recess 13 on the optical performance of the optically functional part 11.

Each constituent member will be described in detail below.

1. Lens Structure

Figure 2A:
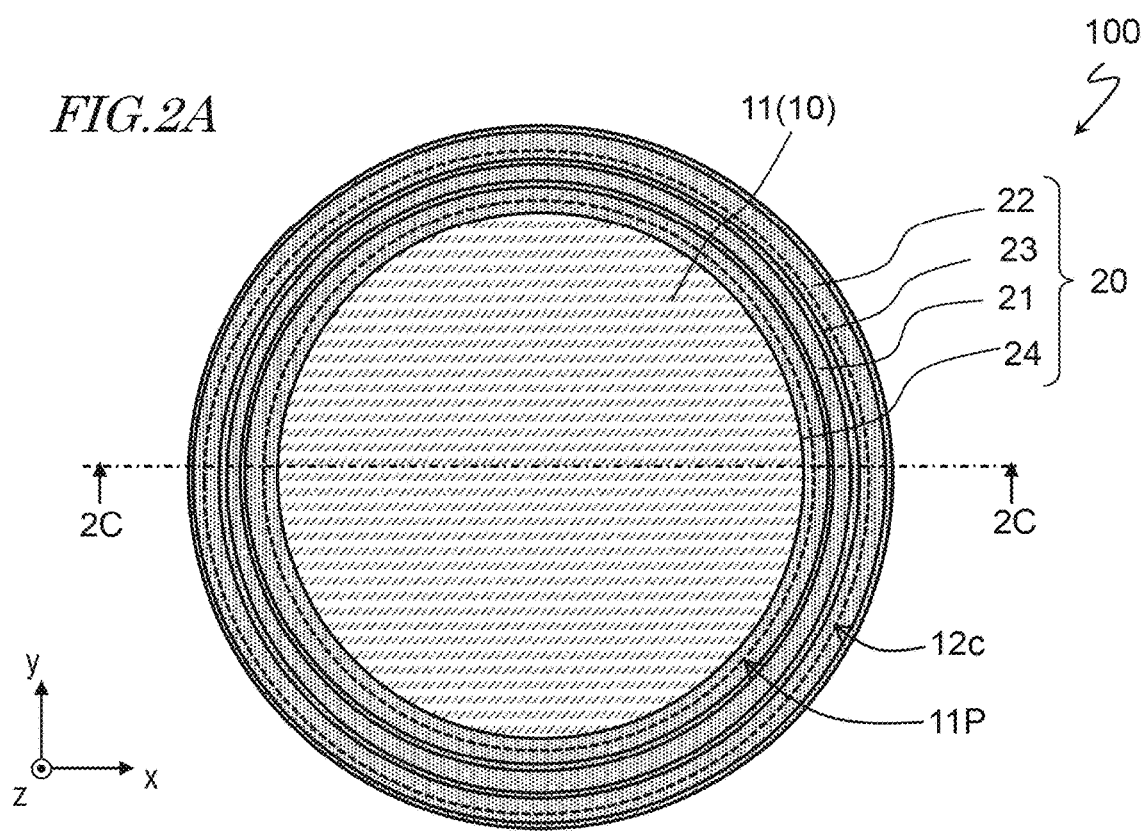
FIG. 2A is a schematic top view of a lens structure according to one embodiment.
Figure 2B:
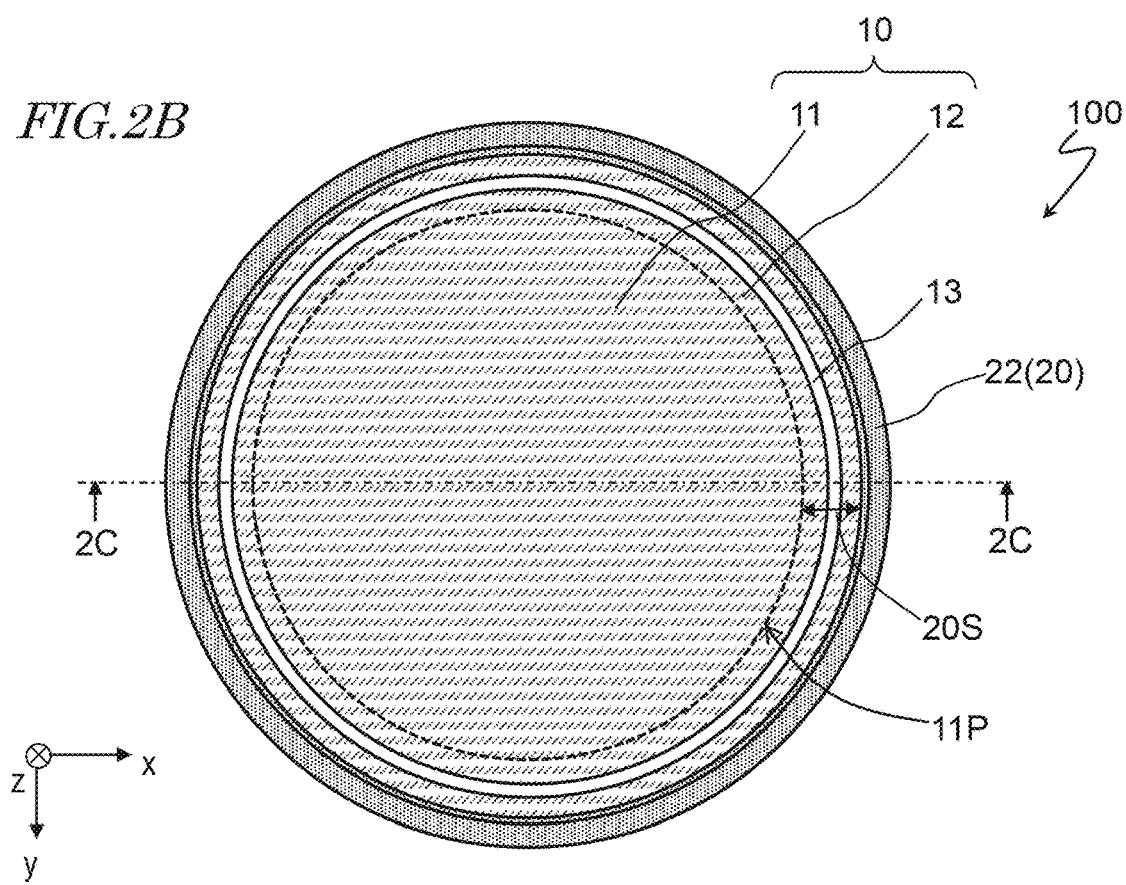
FIG. 2B is a schematic bottom view of a lens structure according to one embodiment.

FIG. 2A is a schematic top view of the lens structure 100. FIG. 2B is a schematic bottom view of the lens structure 100. FIG. 2C is a schematic cross-sectional view taken along line 2C-2C of FIG. 2A and FIG. 2B.

The lens structure 100 includes the lens 10 and the support part 20 formed of a light-shielding material. The lens 10 and the support part 20 are preferably solidly joined. The lens 10 and the support part 20 can be molded in one body through double-shot molding. In the present embodiment, the term "molded in one body through double-shot molding" refers to a molded article made of different materials and/or different colors that are bonded together without using an adhesive.

As shown in FIG. 1A and FIG. 1B, in the present embodiment, the support part 20 is oriented in the +z direction relative to the light-emitting surface 30a of the light source 30, and holds the lens 10 at a position where the light from the light-emitting surface 30a enters the optically functional part 11. The light source device 200 can also include a substrate 40 on which the light source 30 is arranged, where the end part of the support part 20 at the light source 30 side can be secured to the first surface 40a of the substrate 40. This allows a stable holding of the lens 10 at a predetermined location in relation to the light-emitting surface 30a.

The support part 20 can be formed with an opening 25 such that at least a portion of the optically functional part 11 of the lens 10 is exposed at an opposite side relative to the light source 30. Light from the light source 30 incident on the lens 10 is emitted from the upper surface of the lens 10 through the opening 25.

Lens 10

Figure 3A:
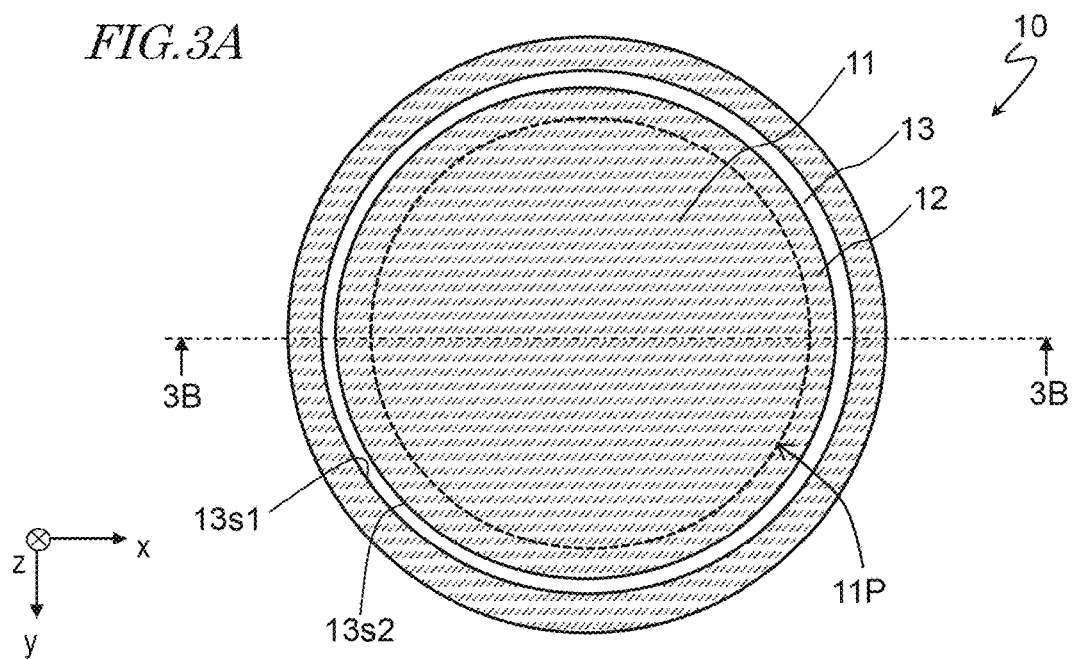
FIG. 3A is a schematic bottom view of a lens according to one embodiment.
Figure 3B:
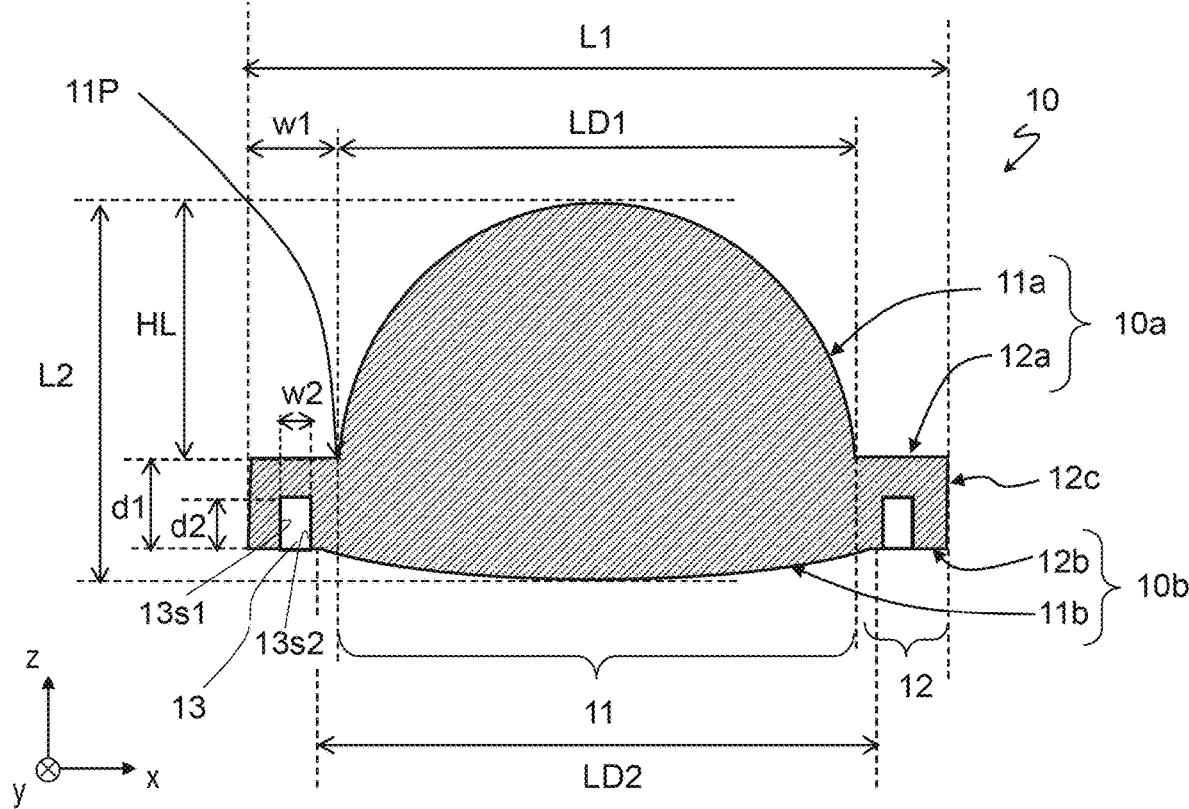
FIG. 3B is a schematic cross-sectional view taken along line 3B-3B of FIG. 3A.

FIG. 3A is a schematic top view of the lens 10, and FIG. 3B is a schematic cross-sectional view taken along line 3B-3B of FIG. 3A.

In the present embodiment, the outer shape of the lens 10 is an approximately circular shape in a plan view, with a diameter L1 preferably in a range of 3.0 to 10.0 mm, for example, about 6.05 mm. The lens 10 has a thickness L2 preferably in a range of 1.0 to 5.0 mm, for example, about 3.2 mm. The outer shape of the lens 10 in a plan view can be appropriately determined. For example, if the lens 10 includes a plurality of lens parts arranged in a two-dimensional array, the outer shape of the lens 10 in the plan view may be an approximately rectangle.

The lens 10 includes the optically functional part 11 and the flange part 12, which is located on the outer side of the optically functional part 11 along the outer periphery 11P of the optically functional part 11. The optically functional part 11 has a first surface 11a and a second surface 11b located opposite side from the first surface 11a. The first surface 11a is located opposite side form the light source and the second surface 11b is located facing the light source. The flange part 12 has a third surface 12a, located on the same side as the first surface 11a, and a fourth surface 12b, located on the same side as the second surface 11b. The flange part 12 is formed with at least one first recess in the fourth surface 12b. The flange part 12 can further include an outer lateral surface 12c adjacent to the third surface 12a and to the fourth surface 12b.

The lens 10 has an upper surface 10a and a lower surface 10b. The upper surface 10a of the lens 10 includes the first surface 11a of the optically functional part 11 and the third surface 12a of the flange part 12. The lower surface 10b of the lens 10 includes the second surface 11b of the optically functional part 11 and the fourth surface 12b of the flange part 12.

In the present specification, "outer periphery 11P of the optically functional part 11" is defined, for example, by the outer edge of the first surface 11a of the optically functional part 11 at the upper surface 10a of the lens 10. In the example shown in FIG. 3A and FIG. 3B, the convex portion of the upper surface 10a of the lens 10 is the first surface 11a of the optically functional part 11, and the approximately flat portion of the upper surface of the lens 10 located outer side of the first surface 11a is the third surface 12a of the flange part 12. Of the lower surface 10b of the lens 10, the portion overlaps the first surface 11a in a plan view is the second surface 11b of the optically functional part 11, and the portion located at an outer side of the second surface 11b is the fourth surface 12b of the flange part 12. The fourth surface 12b contains an approximately flat surface. The fourth surface 12b, may contain a curved surface continuous to the second surface 11b of the optically functional part 11.

Optically Functional Part 11

The optically functional part 11 is configured to refract light passing through the optically functional part 11 from each of the light-emitting parts 30U of the light source 30, and to emit light in predetermined directions. The optically functional part 11 can function as a convex lens such as a biconvex lens, a flat convex lens, or a convex meniscus lens, as a concave lens such as a biconcave lens, a flat concave lens, or a concave meniscus lens, or as a Fresnel lens.

In the present embodiment, the optically functional part 11 functions as a convex lens having a single optical axis with respect to the light-emitting surface 30a of the light source 30. This allows the light emitted from the light-emitting surface 30a to be projected into the area of irradiation that is point-symmetric with respect to a single point on the optical axis. For example, when the plurality of light-emitting parts 30U of the light source 30 are individually turned on (hereinafter referred to as "partial drive"), illumination light having an intensity distribution corresponding to the light emission distribution of the light source 30 can be projected into the irradiation area as described below.

The optically functional part 11 can have a plurality of optical axes with respect to the light-emitting surface of 30a of the light source 30. For example, the optically functional part 11 can include a plurality of lens parts that have different optical axes from one another. Each of the lens parts can be arranged to correspond to one or more of the light-emitting parts 30U of the light source 30.

The first surface 11a of the optically functional part 11 has surface area greater than the surface area of the second surface 11b of the optically functional part 11. The first surface 11a preferably have a surface area in a range of two times to four times greater than a surface area of the second surface 11b. In the present embodiment, the first surface 11a has a surface area preferably in a range of 15.0 to 40.0 mm$^2$, for example, about 27.9 mm$^2$. The second surface 11b preferably have a surface area in a range of 10.0 to 35.0 mm$^2$, for example, about 22.1 mm$^2$.

The shape of the first surface 11a and the second surface 11b can be appropriately determined. For example, the first surface 11a and the second surface 11b can each be a convex surface or a concave surface. In this case, the curvature radius of the first surface 11a, which is a convex surface or a concave surface, can be smaller than the curvature radius of the second surface 11b, which is a convex surface or a concave surface. The first and second surfaces 11a and 11b can be such that the first surface 11a includes a convex surface or a convex surface while the second surface 11b is a flat surface. For example, the first surface 11a includes concave and convex structures that acts as a Fresnel lens, while the second surface 11b is a flat surface.

In the example shown in the figures, the outer shape of the optically functional part 11 in the plan view is an approximately circular shape. The first surface 11a and the second surface 11b of the optically functional part 11 of the lens 10 are both convex surfaces, and the optically functional part 11 functions as a convex lens having a single optical axis. The optical axis of the convex lens can be in parallel to the z-axis. The optically functional part 11 preferably has a focus distance in a range of 3 to 5 mm.

In the example shown in the figures, the curvature radius of the first surface 11a is smaller than the curvature radius of the second surface 11b. The first surface 11a has a curvature radius preferably in a range of 1.5 to 3.0 mm, for example, 2.4 mm. The second surface 11b has a curvature radius preferably in a range of 5.0 to 30.0 mm, for example, 10.0 mm.

The lens diameter of the first surface 11a (the diameter of the first surface 11a in a plan view) LD1 is, for example, preferably in a range of 3.0 to 5.0 mm, for example about 4.21 mm. The first surface 11a has a maximum height HL, for example, preferably in a range of 1.0 to 4.0 mm, for example, about 2.34 mm. In the present embodiment, the term "maximum height HL" of the first surface 11a refers to a length along the z-axis between the third surface 12a and the vertex of the first surface 11a.

As shown in the figures, the lower surface 10b of the lens 10 may have a convex surface with a lens diameter of LD2 that is greater than a lens diameter of the first surface 11a LD1. In this case, a portion of the convex surface formed on the lower surface 10b serves as the second surface 11b of the optically functional part 11. The lens diameter LD2 is, for example, preferably in a range of 4.0 to 6.0 mm, for example, about 5.3 mm.

Flange Part 12

The flange part 12 can be positioned along the entire outer periphery 11P of the optically functional part 11. In the example shown in the figures, the outer lateral surface 12c of the flange part 12 is outward of the outer periphery 11P of the optically functional part 11, and extends approximately parallel to the outer periphery 11P, in a plan view. The flange part 12 has a width w1 preferably in a range of 0.7 to 1.1 mm, for example 0.92 mm. The flange part 12 has a thickness d1 preferably in a range of 0.3 to 0.7 mm, for example 0.5 mm. The thickness d1 of the flange part 12 refers to a shortest distance between the third surface 12a and a portion of the fourth surface adjacent to the outer lateral surface 12c of the flange part 12, exclusive of the portion of the fourth surface defining the at least one first recess 13.

The flange part 12 is formed with at least one first recess 13 in the fourth surface 12b. This arrangement will increase the contact area between the lower surface 10b of the lens 10 and the lower mold in the double-shot molding process described below, which can increase the adhesion between the lens 10 and the lower mold. This arrangement makes it possible to more reliably separate the lens 10 from the upper mold when the mold is opened to release the lens 10, while holding the lens 10 held on the lower mold. Therefore, after molding the lens 10, the support part 20, that is a secondary molded article can be molded continuously.

The at least one first recess 13 is defined in the flange part 12 that is located outside of the optically functional part 11, the effect of the at least one first recess 13 on the optical action of the optically functional part 11 can be reduced or prevented. The at least one first recess 13 is preferably formed spaced apart from the outer periphery 11P of the optically functional part 11. With this arrangement, the effect of the at least one first recess 13 on the optical action of the optically functional part 11 can be further reduced or prevented.

The at least one first recess 13 can be defined with an appropriate shape in a plan view. The at least one first recess 13 can be formed in a groove shape extending along the outer periphery 11P of the optically functional part 11. The first recess 13 can be formed in a circular shape, an elliptic shape, or a rectangular shape in a plan view. The lateral surface(s) defining the at least one first recess 13 can be approximately perpendicular to the third surface 12a of the flange part 12, or can be inclined with respect to a plane that is perpendicular to the third surface 12a. The corners of the at least one first recess 13 can be formed with a rounded corner or rounded corners (R-shaped) in a cross-sectional view, at a portion or portions opposite to the opening of the first recess 13.

The flange part 12 can be formed with a plurality of the first recesses 13. The arrangement, an arrangement pitch, etc., of the plurality of the first recesses 13 can be appropriately determined. For example, the plurality of the first recesses 13 can be arranged spaced apart from one another along the outer periphery 11P of the optically functional part 11. When the width w1 of the Flange part 12 is large enough, two or more of the first recesses 13 can be arranged in the width direction of the flange part 12. From the viewpoint of preventing occurrence of retention of the lens 10 in the upper mold when demolding the molded lens 10 to be described below, the plurality of the first recesses 13 are preferably arranged approximately evenly spaced apart from one another along the entire outer periphery of the flange part 12.

In the example shown in FIG. 3A and FIG. 3B, the first recess 13 is a groove that surrounds the optically functional part 11 in a plan view. The lateral surfaces defining the first recess 13 include, for example, a first lateral surface 13s1 along the outer periphery 11P of the optically functional part 11, and a second lateral surface 13s2 facing the first lateral surface 13s1 and located closer to the optically functional part than the first lateral surface 13s1. Providing the first recess 13 in a form of a groove surrounding the optically functional part 11 can enhance adhesion of the entire flange part 12 of the lens 10 with the lower mold in a step of demolding a first molded article.

The first recess 13 is formed with a width w2 that is preferably ½ or less, more preferably ⅓ or less with respect to a width w1 of the flange part 12. The width of the first recess 13 is, for example, preferably in a range of 0.25 to 0.60 mm, for example, about 0.30 mm. The first recess 13 is formed with a depth from the fourth surface 12b (i.e., a maximum length in the z-axis direction) d2 that is preferably ½ or greater with respect to a thickness d1 of the flange part 12. From the perspective of the strength of lens 10, the depth d2 of the first recess 13 can be set to ⅘ or less with respect to the thickness d1 of the flange part 12. The depth d2 of the first recess 13 is preferably in a range of 0.25 to 0.40 mm.

Figure 4A:
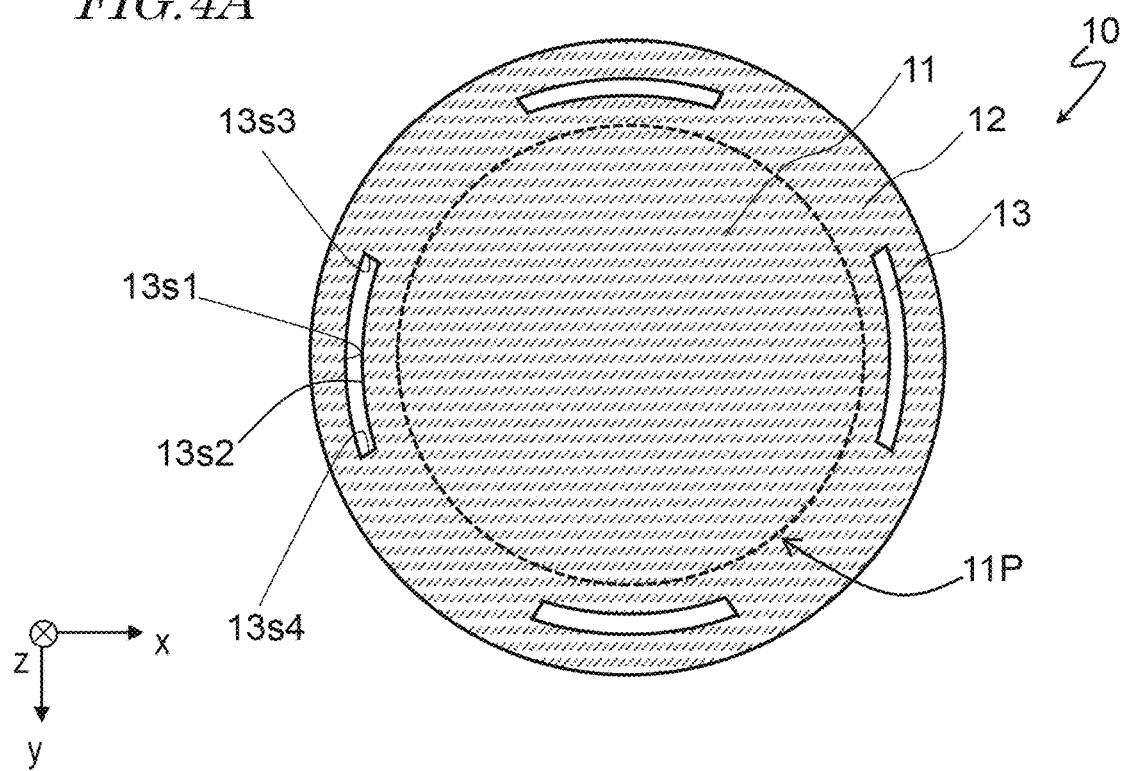
FIG. 4A is a schematic bottom view of another lens according to one embodiment.
Figure 4B:
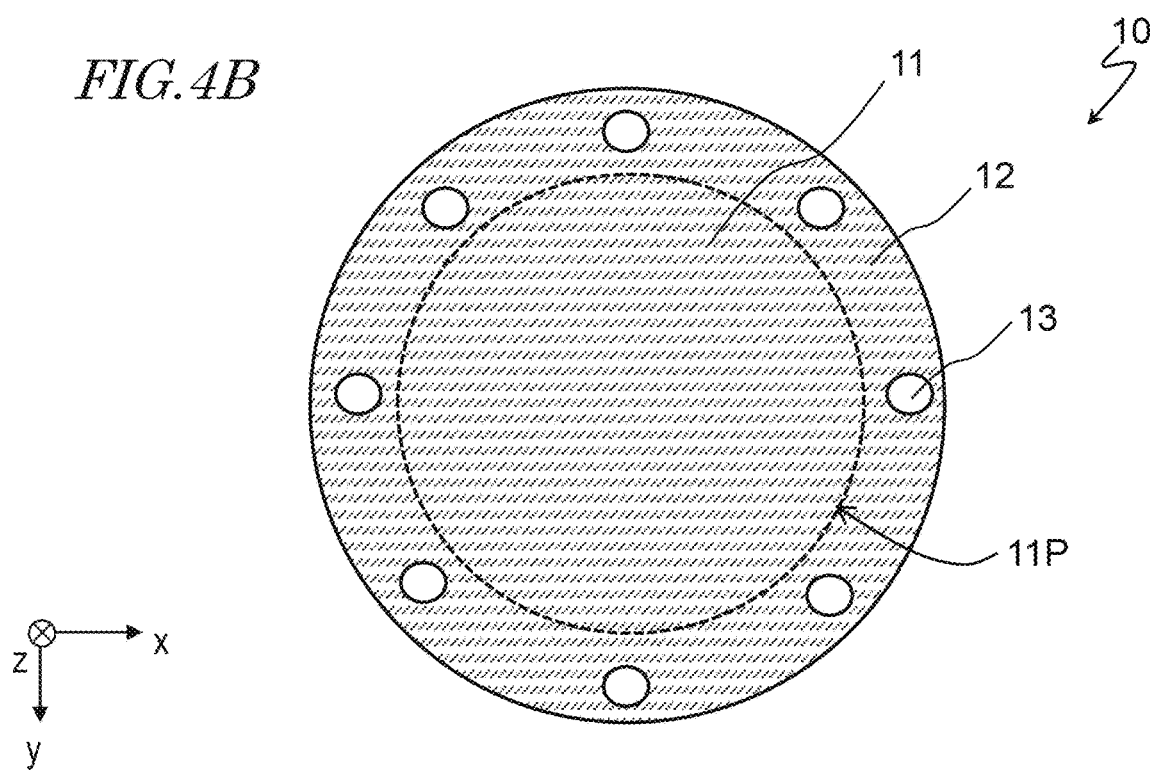
FIG. 4B is a schematic bottom view showing still another lens according to one embodiment.

FIG. 4A and FIG. 4B are each a bottom view of the lens 10, to illustrate other examples of the first recess 13. As shown in FIG. 4A and FIG. 4B, a plurality of the first recesses 13 are arranged spaced apart from one another in the fourth surface 12b of the flange part 12. The plurality of the first recesses 13 can be arranged with approximately equal spacing along the outer periphery 11P.

In the example shown in FIG. 4A, each of the first recesses 13 is a groove that extends along a portion of the outer periphery 11P of the optically functional part 11 in a plan view. The lateral surfaces defining each of the first recesses 13 includes include, for example, a first lateral surface 13s1 and a second lateral surface 13s2, which are approximately in parallel to the outer periphery 11P, and a third lateral surface 13s3 and a fourth lateral surface 13s4, which extend in directions crossing the outer periphery 11P in a plan view. The lateral surfaces defining each of the first recesses 13 containing a plurality of lateral surfaces extending in different directions in a plan view, can improve adhesion between the lower surface 10b of the lens 10 and the lower mold. As shown in FIG. 4B, each of the first recesses 13 can be formed in a circular shape in a plan view.

Other than the configurations illustrated in FIG. 3A, FIG. 3B, FIG. 4A, and FIG. 4B, the shape, the arrangement, and the number of the first recesses 13 can be appropriately determined. As described below, the at least one first recess 13 can be formed with at least one protrusion and/or at least one second recess in at least one of the lateral surfaces defining the at least one first recess. This arrangement can further improve the adhesion of the lower surface 10b of the lens 10 and the lower mold during mold opening after molding the lens 10 in a double-shot molding process to be described further below. Accordingly, occurrence of retention of the lens 10 in the upper mold can be efficiently reduced or prevented.

The fourth surface 12b of the flange part 12 can be formed with a plurality of the first recesses 13 defined by different shapes. For example, the plurality of the first recesses 13 can include the first recess (groove) 13 formed in an annular shape as shown in FIG. 3A and FIG. 3B, and the first recess 13 formed in a circular shape (or a rectangular shape) as shown in FIG. 4B, in a planar view.

The lens 10 can be formed of a light-transmissive resin, for example, a thermoplastic resin. Examples of the thermoplastic resin include polycarbonate, acrylic, cyclic polyolefin, polyethylene terephthalate, and polyester. Thermoplastic resin materials are preferred because they can be manufactured efficiently by injection molding. Of those, it is preferable to use polycarbonate, which has high transparency and is inexpensive. Alternatively, the lens 10 can be formed of a thermosetting resin, such as silicone resin or epoxy resin.

Support Part 20

As shown in FIG. 2A to FIG. 2C, the support part 20 is configured to support at least the flange part 12 of the lens 10. The support part 20 can be in contact with at least a part of the third surface 12a and/or at least a part of the outer lateral surface 12c of the flange part 12.

In the present embodiment, the support part 20 has a contact surface 20S that is in contact with at least part of the third surface 12a of the flange part 12. The support part 20 can be in contact with the entire third surface 12a of the flange part 12. The support part 20 preferably covers an entirety of the third surface 12a and of the outer lateral surface 12c of the flange part 12. This allows the support part 20 to support the lens 10 (in detail, the flange part 12 of the lens 10) in a stable manner.

The support part 20 can be positioned to at least partially overlapping the at least one first recess 13 of the flange part 12 of the lens 10 in a plan view. In other words, the contact surface 20S of the support part 20 that is in contact with the third surface 12a of the flange part 12, and at least one of the first recesses 13 of the flange part 12, can at least partially overlap with each other. With this arrangement, the at least one first recesses 13 are at locations not to affect the optical action of the optically functional part 11. As shown in the FIG. 2B, it is preferable that the contact surface 20S of the support part 20 covers the entirety of the at least one first recess 13 in a plan view.

When the flange part 12 is formed with a plurality of the first recesses 13, the contact surface 20S of the support part 20 may at least partially cover the plurality of the first recesses 13 in a plan view, but preferably covers all the plurality of the first recesses 13 in a plan view.

In the example shown in the figures, the support part 20 includes a first hood portion 21, a second food portion 22, a first flange portion 23, and a second flange portion 24.

The first hood portion 21 and the second hood portion 22 have a cylindrical or other cylindrical outer shape that is tapered toward the direction in which light is emitted. In other words, the first hood portion 21 and the second hood portion 22 are tilted toward the optical axis of the convex lens along the +z direction. The first hood portion 21 extends from the third surface 12a of the flange part 12, in an opposite direction to the light source. The first hood portion 21 preferably has a shape tapering in the +z direction. The second hood portion 22 extends from the outer lateral surface 12c of the flange part 12 to the light source side. The second hood portion 22 can be secured to the substrate where the light source is located.

It is preferable that the first hood portion 21 at least partially overlaps with at least one of the first recesses 13 of the flange part 12 in a plan view, and it is more preferable that the first hood portion overlaps with the entirety of the first recesses 13 in a plan view. The first recesses 13 are preferably arranged inward of the second hood portion 22 in a plan view. Further, it is preferable that the support part 20, including the first hood portion 21 and the second hood portion 22, is not in contact with a portion of the flange part defining at least one of the first recesses 13. This allows the support part 20 to support the lens 10 (in detail, the flange part 12 of the lens 10) in a stable manner. It can also reduce or prevent light from the light source 30 from leaking outside the support part 20 (in detail, outer side of the +/−x direction or +/−y direction of the first and second hood portions 21, 22).

The outer surface of the first hood portion 21 can be located inward of the outer surface of the second hood portion 22 in a plan view. In this case, the support part 20 can include a first flange portion 23 located outer side with respect to the first hood portion 21 and also at an upper end (in the +z direction) of the second hood portion 22. The first flange portion 23 surrounds the first hood portion 21 in a plan view. The first flange portion 23 has an approximately flat upper surface and a lateral surface continuous with the outer lateral surface of the second hood portion 22.

The second flange portion 24 of the support part 20 covers an edge portion of the first surface 11a of the optically functional part 11. In the present embodiment, the opening 25 of the support part 20 is defined by an inner edge of the second flange portion 24 of the support part 20. The second flange portion 24 of the support part 20 can be located between the first hood portion 21 and the optically functional part 11. The second flange portion 24 of the support part 20 can serve as a diaphragm of the optically functional part 11.

In the present embodiment, the support part 20 has a maximum width S1 preferably in a range of 4.0 to 15.0 mm, for example about 6.9 mm, and a height S2 preferably in a range of 1.5 to 7.0 mm, for example 4.03 mm. The "maximum width S1" of the support part 20 refers to a maximum width of the outer shape of the second hood portion 22. The "height S2" of the support part 20 refers to a length between a lower end of the second hood portion 22 and an upper end of the first hood portion 21 along the z-axis direction.

The first hood portion 21 has a height H1 that can be set to be, for example, approximately equal to the maximum height HL of the first surface 11a of the optically functional part 11, or greater than the maximum height HL. The "height H1 of the first hood portion 21" refers to a length along the z-axis direction between the third surface 12a and the upper end of the first hood portion 21. The height H1 of the first hood portion 21 is preferably in a range of 1.1 to 4.1 mm, for example 2.44 mm.

The second hood portion 22 has a height H2 that is set so that a space is formed between the second surface 11b of optically functional part 11 and the light-emitting surface 30a of the light source 30. The "height H2 of the second hood portion 22" refers to a length along the z-axis direction between the third surface 12a and the lower end of the second hood portion 22. The height H2 of the second hood portion 22 is, for example, preferably in a range of 0.5 to 3.0 mm, for example 1.59 mm.

The second flange portion 24 of the support part 20 has a thickness H3 from the third surface 12a of the flange part 12 is, for example, preferably in a range of 0.1 to 0.5 mm, for example, 0.3 mm.

Other than those described above, the support part 20 can have an appropriate structure. The support part 20 may not be formed with the first hood portion 21 or/and the second hood portion 22. Depending on the shape of the outer surface of the support part 20, the first flange portion 23 may not be formed. Further, the support part 20 may not formed with the second flange portion 24 of the support part 20.

The support part 20 is formed of, for example, a dark-colored resin material. The support part 20 can contain a resin that is a base material and a colorant that is dispersed in the resin. As the base material, a thermoplastic resin can be used. Examples of the thermoplastic resin include polycarbonate, acrylic, cyclic polyolefin, polyethylene terephthalate, and polyester. It is preferable to use polycarbonate resin. The resin material used as the base material of the support part 20 and the resin material used for the lens 10 can be the same or different. By using the same resin material as the lens 10, the adhesion between the lens 10 and the support part 20 can be improved. When the lens 10 is formed using thermosetting resin, the support part 20 may contain thermosetting resin as the base material.

Various kinds of dyes and/or pigments can be used appropriately as a colorant to be added to the resin that serves as the base material. Specific examples thereof include $Cr_2O_3$, $MnO_2$, $Fe_2O_3$, and carbon black.

Positional Relation Between Lens Structure 100 and Light Source 30

As shown in FIG. 1A and FIG. 1B, the opening 25 of the lens 10 is at least partially overlapped with the light-emitting surface 30a in a plan view. Preferably, the entire light-emitting surface 30a is located within the opening 25 of the lens 10 in a plan view. Accordingly, light emitted from the light-emitting surface 30a can be more efficiently emitted through the opening 25.

The shortest distance between the light-emitting surface 30a of the light source 30 and the second surface 11b of optically functional part 11 of the lens 10 is preferably in a range of 0.1 to 0.7 mm, for example, 0.4 mm. Between the light-emitting surface 30a of the light source 30 and the lower surface of the lens 10 can be a hollow (air layer). Alternatively, a light-transmissive resin can be placed between the light-emitting surface 30a and the lower surface 10b of the lens 10.

For flat-plane viewing, the size of opening 25 is set to be at least as large as the size of the light-emitting surface 30a, for example. The area A1 of the opening 25 in a plan view can be in a range of 1.3 to 2.3 times of the area A2 of the light-emitting surface 30a. In the present embodiment, the opening 25 is formed in a circular shape with a diameter of 4.21 mm, and the area A1 of the opening 25 is 13.92 $mm^2$. The area A2 of the light-emitting surface 30a is 7.68 $mm^2$ (3.12 mm×2.46 mm). Therefore, the area ratio (A1/A2) of the opening 25 with respect to the light-emitting surface 30a in a plan view is 1.81. A preferable area ratio (A1/A2) can vary depending on the shortest distance D between the light-emitting surface 30a and the second surface 11b of the optically functional part 11.

When the first surface 11a is a convex surface with a single optical axis, a portion of the first surface 11a of the lens 10 that is located in the opening 25 (i.e., portion not to covered by the support part 20) has a surface area A3 in a range of 2.5 to 4.5 times greater with respect to the area A2 of the light-emitting surface of the light source 30. In the present embodiment, the surface area A3 of the first surface 11a located inside the opening 25 is 26.0 $mm^2$, and the area A2 of the light-emitting surface 30a is 7.68 $mm^2$. Therefore, the area ratio (A3/A2) of the surface area A3 of the first surface 11a with respect to the area A2 of the light-emitting surface 30a is 3.39.

2. Light Source

Figure 5A:
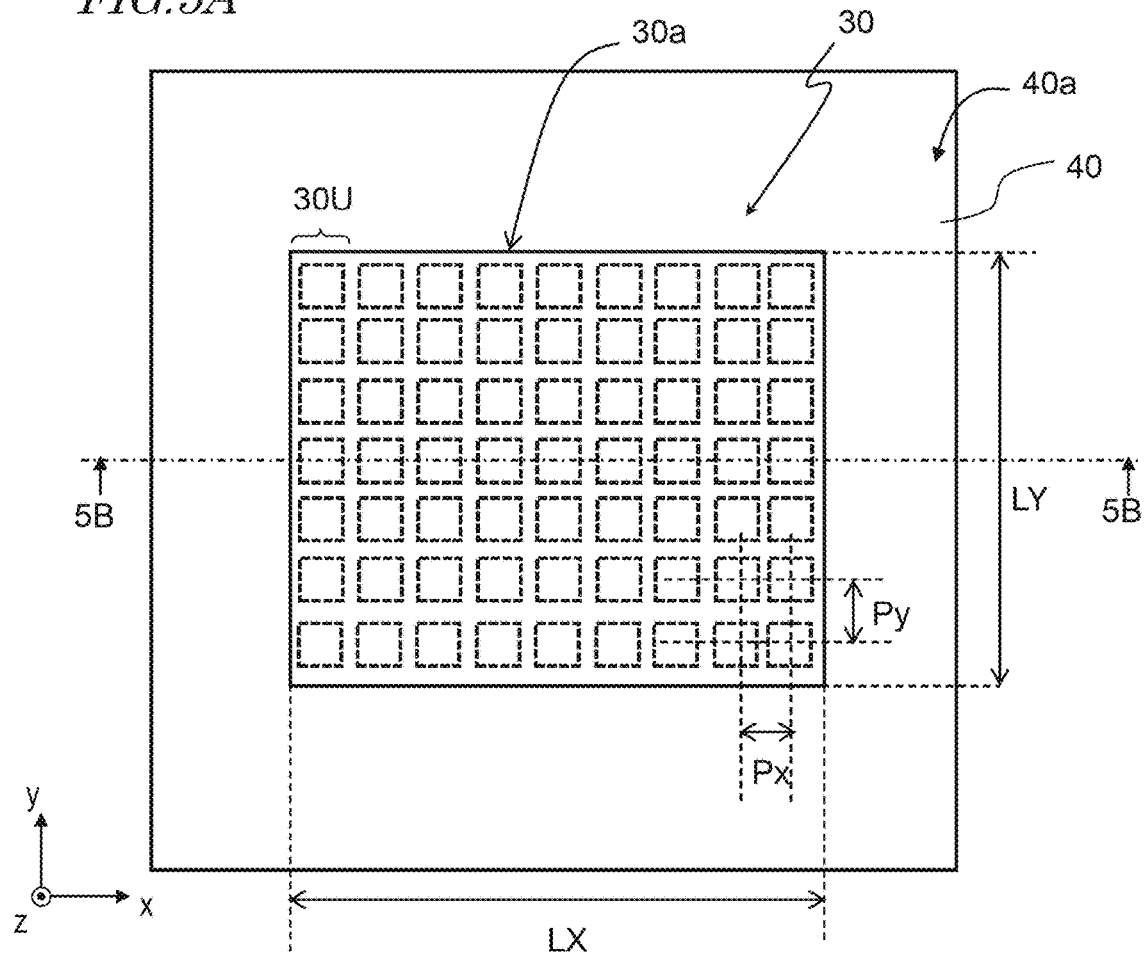
FIG. 5A is a schematic top view showing a light source according to one embodiment.
Figure 5B:
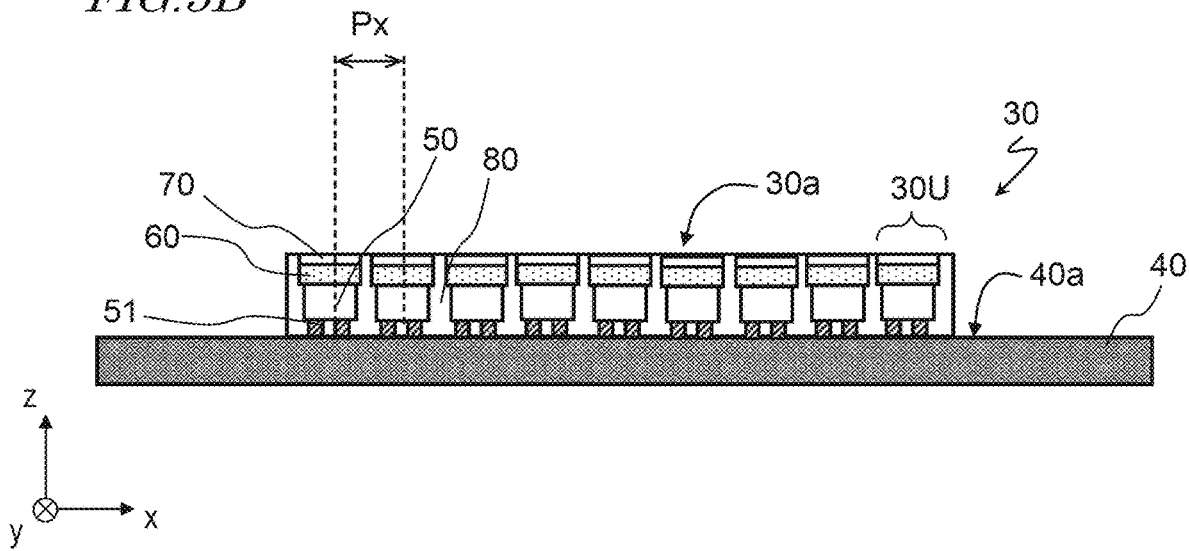
FIG. 5B is a schematic cross-sectional view taken along line 5B-5B of FIG. 5A.

FIG. 5A is a schematic top view showing the light source 30 and FIG. 5B is a schematic cross-sectional view taken along line 5B-5B of FIG. 5A.

In the configurations shown in FIG. 5A and FIG. 5B, the light source 30 has an approximately rectangular shape. Each side of the outer shape of the rectangular shape is in parallel to the x-axis or the y-axis shown in the figures. The outer shape of the light source 30 in a plan view does not have to be a rectangular shape.

The light source 30 is disposed, for example, on a first surface of the substrate 40 that includes wirings 42. The substrate 40 has an outer shape of an approximately rectangular shape in a plan view. The substrate 40 can other shapes such as a circular shape.

The light source 30 has an upper surface including a light-emitting surface 30a. The light source 30 includes a plurality of light-emitting parts 30U arranged in a two dimensional array. In other words, the light-emitting surface 30a of the light source 30 is demarcated into a plurality of unit regions corresponding to the plurality of light-emitting parts 30U.

The plurality of light-emitting parts 30U are, for example, aligned in a two dimensional array along the x-axis direction and the y-axis direction, and the arrangement pitch along the x-axis direction is equal to the arrangement pitch along the y-axis direction. The alignment directions of the light-emitting parts 30U can be appropriately determined. The arrangement pitch in the x-axis direction and the y-axis direction can be different, and the two directions of the alignment do not have to be orthogonal. Also, the arrangement pitch can be uneven other than equal spacing.

It is preferable that the number of the light-emitting parts 30U, i.e., the number of demarcations of the light-emitting surface 30a is, for example, 16 or greater. This allows more precise control of the luminance distribution on the light-emitting surface 30a. Meanwhile, when the number of the light-emitting parts 30U is 15 or less, the need for an increase in the size of the light source 30 can be reduced.

When the light source device 200 is applied to a camera's flashlight, the light-emitting surface 30a can be demarcated in view of an aspect ratio of an image. When the aspect ratio is 4:3, the light-emitting surface 30a can be demarcated with a total of 63 light-emitting parts 30U aligned 9 parts in the x-axis direction and 7 parts in the y-axis direction (represented as "9×7"), or can be demarcated with 7×5, a total of 35 light-emitting parts 30U.

In the example shown in the figures, the light source 30 includes a total of 63 of the light-emitting parts 30U arranged in a matrix of 9×7. For example, the light-emitting surface 30a of the light source 30 has a length LX of 3.12 mm along the x-axis direction and a length LY of 2.46 mm along the y-axis direction. The arrangement pitches Px and Py in the x-axis direction and the y-axis direction respectively, of the light-emitting parts 30U are, for example, 330 µm. The thickness (length along the z-axis direction) of the light source 30 is, for example, 230 µm.

The plurality of light-emitting parts 30U can be operated independently of each other. This allows only the selected light-emitting part(s) out of the plurality of light-emitting parts 30U to be caused to emit light and the other light-emitting parts not to emit light (partial drive). By partially driving the plurality of light-emitting parts 30U, it is possible to irradiate (project) light with a predetermined intensity distribution. Accordingly, for example, when using the light source device 200 of the present embodiment as a flashlight of a camera, the luminance distribution of the irradiating light is controlled according to the information of the area of the light being illuminated (position and distance of the subject, etc.), thereby reducing black crushing and halation, allowing to capture sharper photos.

Depending on the application of the light source device, some or all of the plurality of light-emitting parts 30U can be operated in a state of continuously emitting light.

For the light source 30, any appropriate surface light-emitting light source known in the art can be used. Preferably, the light source 30 has a structure in which a plurality of light-emitting elements 50, such as light-emitting diodes, are arranged in a two dimensional array. The plurality of light-emitting elements 50 are arranged corresponding to the plurality of light-emitting parts 30U. Each of the plurality of light-emitting parts 30U includes one or more corresponding light-emitting elements among the plurality of light-emitting elements 50. By individually causing one or more of the light-emitting elements 50 to emit light in each light-emitting part 30U, a partial drive of the light-emitting parts 30U can be achieved, and the intensity distribution in the light-emitting surface 30a can be controlled.

In the present embodiment, the light source 30 includes a plurality of light-emitting elements 50, a plurality of wavelength converting layers 60, a plurality of light-diffusing layers 70, and a light-reflecting member 80. Each component of the light source 30 will be described below.

Light-Emitting Element 50

The plurality of light-emitting elements 50 are arranged in a two dimensional array in a plan view. In the present embodiment, each of the light-emitting parts 30U has a corresponding one of the light-emitting elements 50. Two or more light-emitting elements 50 can be disposed to each of the light-emitting parts 30U.

In the example shown in the figures, a plurality (63 in the example) of light-emitting elements 50 are aligned in two directions perpendicular to each other, i.e., in the x-axis direction and the y-axis direction, and are spaced apart from each other. The "arrangement pitch" of the light-emitting elements 50 refers to a distance between centers of two adjacent light-emitting elements in a plan view. In this example, the arrangement pitches of the light-emitting elements 50 is the same as the arrangement pitches Px and Py, for example, 330 µm, of the light-emitting parts described above.

The arrangement pitches of the light-emitting elements 50 in the x-axis direction and in the y-axis direction can be the same or different, or the two directions of the arrangement do not have to be orthogonal. Also, the arrangement pitches can be in equal spacing or in uneven spacing. For example, the plurality of light-emitting elements 50 can be arranged with increasing distance to adjacent light-emitting elements 50 from the center toward the periphery of the substrate 40.

Figure 5C:
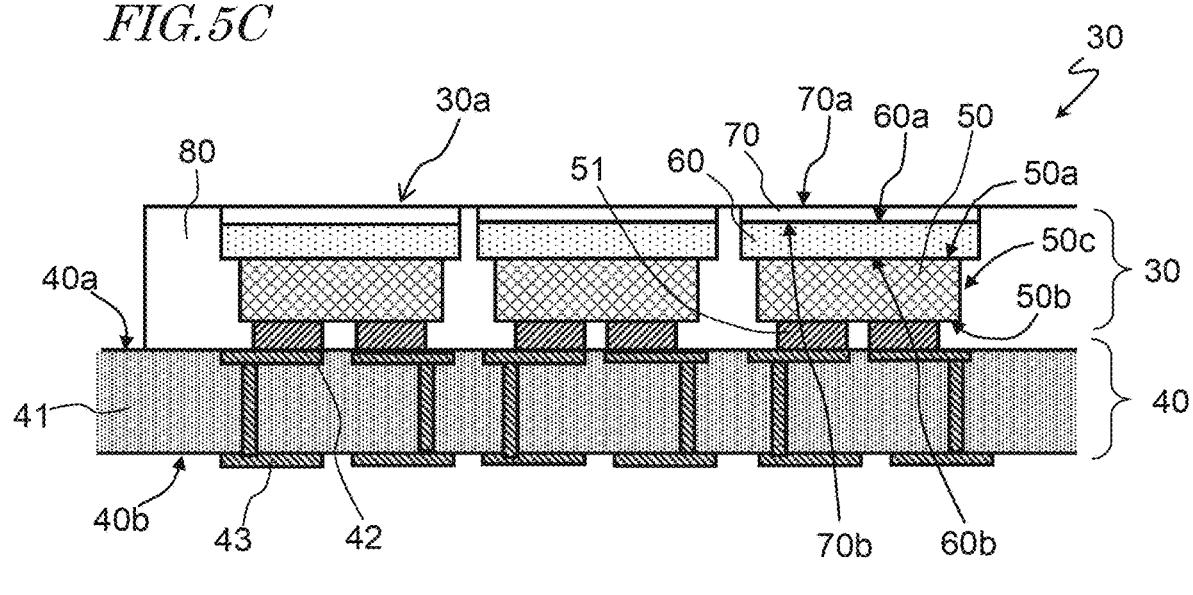
FIG. 5C is an enlarged schematic cross-sectional view of a portion of a light source.

FIG. 5C shows an enlarged cross-sectional view showing a portion of the light source 30, in which a portion illustrated includes three light-emitting elements of the plurality of light-emitting elements 50.

As shown in FIG. 5C, each light-emitting element 50 includes a light emission surface 50a from which light is mainly extracted, an electrode forming surface 50b located opposite side from the light emission surface 50a, and lateral surfaces 50c located between the light emission surface 50a and the electrode forming surface 50b, and at least has a positive and a negative electrodes 51 on the electrode forming surface 50b. The electrodes 51 are electrically connected to respective portions of the wirings 42 exposed on the substrate 40. For example, a wavelength converting layer 60 is disposed on the light emission surface 50a of each of the light-emitting elements 50.

For the light-emitting element 50, various types of light-emitting elements such as a semiconductor laser element, a light-emitting diode, or the like can be employed. In the present embodiment, a light-emitting diode is employed as a light-emitting element 50. The wavelength of the light emitted by the light-emitting element 50 can be appropriately determined. For example, a light-emitting element configured to emit light of a blue color or a green color, a light-emitting element having a nitride-based semiconductor (In$_x$Al$_y$Ga$_{1-x-y}$N, 0≤x, 0≤y, x+y≤1), ZnSe, or GaP can be employed. For example, for a red-light-emitting element, a light-emitting element having a semiconductor such as GaAlAs, AlInGaP, or the like can be employed. Semiconductor light-emitting elements made of materials other than those described above can also be used. The composition, the color of emitting light, the size and the number of the light-emitting elements to be employed can be selected appropriately. The light-emitting layer of the light-emitting element 50 preferably includes a nitride-based semiconductor (In$_x$Al$_y$Ga$_{1-x-y}$N, 0≤x, 0≤y, x+y≤1) configured to emit light having a short-wavelength that can efficiently excite a wavelength converting material contained in the wavelength converting layer 60. The emission wavelength can be variously set by the materials and/or mixed crystal ratio of the semiconductor layer. The positive and negative electrodes can be disposed on the same side, or the positive and negative electrodes can be disposed on different surfaces.

The light-emitting element 50 includes, for example, a light-transmissive substrate such as sapphire, and a semiconductor layered structure layered on the light-transmissive substrate. The semiconductor layered structure includes a light-emitting layer, an n-type semiconductor layer, and a p-type semiconductor layer, the light-emitting layer being located between the n-type and the p-type semiconductor layers. A positive electrode is electrically connected to the n-type semiconductor layer and a negative electrode is electrically connected to the p-type semiconductor layer. The lower surfaces of the positive and negative electrodes 51 are respectively electrically connected to corresponding wirings 42 provided to the substrate 40.

The electrodes 51 are formed of a known metal material that can be electrically connected to the semiconductor layered structure. Examples of the material of the electrodes 51 include metal such as Ni, Pt, Cu, Au, Ag, and AuSn. Preferably Cu is used. The electrodes 51 can have a single layer structure or a layered structure. A terminal protective film can be formed to cover the electrodes 51. For example, as the terminal protective film, a Ni film (thickness: e.g., 5 nm) may be formed on the surface of the electrodes 51 made of Cu, and an Au film (thickness: e.g., 25 nm) may be formed on the Ni film.

The light-emitting elements 50 have a rectangular shape in a plan view, for example. The size of the light-emitting elements 50 can be appropriately determined. Each of the light-emitting elements 50 has a longitudinal length and a lateral length of, for example, 1,000 µm or less, preferably 500 µm or less, further preferably 300 µm or less. With this size of light-emitting elements 50, it is possible to increase the number of demarcations of the light-emitting surface 30a while reliably obtaining the light intensity of each of the light-emitting elements 50. Therefore, when the light source 30 is partially driven, a sufficient light-dark contrast can be created with a smaller unit in the irradiated area.

In the present embodiment, each of the light-emitting elements 50 has a square shape with a side of 220 µm. In each of the light-emitting elements 50, the light-transmissive substrate and the semiconductor layered structure have a thickness of, for example, 120 µm, and the electrodes 51 have a thickness of, for example, 40 µm. The arrangement pitches of the light-emitting elements 50 in the x-axis direction and the y-axis direction are, for example, 330 µm, as described above.

Wavelength Converting Layer 60

The wavelength converting layer 60 is located above the light emission surface 50a of each of the light-emitting elements 50 (in the +z direction) and covers the light emission surface 50a of the light-emitting element 50. The wavelength converting layer 60 absorbs at least a portion of the light emitted from the light-emitting element 50 and emit light of a different wavelength.

The wavelength converting layer 60 has an upper surface 60a, a lower surface 60b located opposite side from the upper surface 60a and facing the light-emitting element 50. The lower surface 60b of the wavelength converting layer 60, can be bonded or adhered to the light emission surface 50a of the light-emitting element 50.

The wavelength converting layer 60 can have an approximately rectangular shape in a plan view. It is preferable that the wavelength converting layer 60 is larger than the light emission surface 50a of the light-emitting element 50 and covers the entire light emission surface 50a. With this arrangement, light emitted from the light-emitting element 50 can be efficiently incident on the wavelength converting layer 60, facilitating emission of wavelength-converted light from the wavelength converting layer 60 can be obtained. Further, it is possible to reduce a decrease in brightness at portions of the light-emitting surface 30a corresponding to the portions between the light-emitting elements.

In the present embodiment, the wavelength converting layer 60 has, for example, a square shape in a plan view, with a side of 305 µm. The wavelength converting layer 60 has a thickness of, for example, 40 µm in the z-axis direction.

In the present embodiment, the wavelength converting layer 60 is provided for each of the light-emitting elements 50, but a single wavelength converting layer common to the plurality of light-emitting elements 50 can be provided.

The wavelength converting layer 60 includes, for example, a resin as a base material, and a wavelength converting material dispersed in the resin. Examples of the base material include light-transmissive materials such as epoxy resin, silicone resin, resins that are mixtures of those, and glass. In view of light-resisting properties and ease of molding, silicone resin is preferably be selected for the base material of the wavelength converting layer 60. In particular, it is preferable to use phenyl silicone resin as a main component of the base material. The wavelength converting layer 60 having ceramic or glass as the main material and containing a wavelength converting material can be employed.

The wavelength converting material is configured to be excited by light emitted from the light-emitting element 50 and emit light having a wavelength different from that of light emitted from the light-emitting element 50. Examples of the wavelength converting material include yttrium aluminum garnet (YAG)-based fluorescent materials activated with cerium (for example, $Y_3(Al, Ga)_5O_{12}:Ce$), lutetium aluminum garnet (LAG)-based fluorescent materials activated with cerium (for example, $Lu_3(Al, Ga)_5O_{12}:Ce$), terbium aluminum garnet-based fluorescent materials (for example, $Tb_3(Al, Ga)_5O_{12}:Ce$), nitrogen-containing calcium aluminosilicate ($CaO-Al_2O_3-SiO_2$)-based fluorescent materials activated with europium and/or chromium, silicate (($Sr, Ba)_2SiO_4$)-based fluorescent materials activated with europium, β-sialon fluorescent materials (for example, $(Si, Al)_3(O, N)_4:Eu$), α-sialon fluorescent materials (for example, $M_z(Si, Al)_{12}(O, N)_{16}$ (in which $0<Z\leq2$, M is at least one element selected from the group consisting of Li, Mg, Ca, Y, and lanthanoid elements except for La and Ce), nitride-based fluorescent materials such as CASN-based fluorescent materials (for example, $CaAlSiN_3:Eu$) or SCASN-based fluorescent materials (for example, $(Sr, Ca)AlSiN_3:Eu$), fluoride-based fluorescent materials such as KSF-based fluorescent materials (for example, $K_2SiF_6:Mn^{4+}$) or MGF-based fluorescent materials (for example, $3.5 MgO\cdot0.5 MgF_2\cdot GeO_2:Mn$), sulfide-based fluorescent materials, perovskite, chalcopyrite, and quantum dots. Fluorescent materials other than those shown above that can exert similar performance, action, and/or effect can also be employed. The wavelength converting layer 60 containing one wavelength converting material of one of the types of wavelength converting substances shown above can be employed, but the wavelength converting layer 60 containing two or more types of wavelength converting substances is preferable. For example, the wavelength converting layer 60 preferably contain an LAG-based fluorescent material configured to produce light in green region, and a CASN-based fluorescent material configured to produce light in red region. Accordingly, the light source 30 to emit a white light can be realized. Further, the inclusion of two or more types of wavelength converting materials can broaden the wavelength band and reduce generation of wavelength regions with weak luminance intensity. The content of a wavelength converting material (fluorescent material) in the wavelength converting layer 60 can be, for example, in a range of 10 to 80 weight %. In the present specification, the term "weight %" refers to a ratio of the weight of the contained substance(s) to a total weight that includes the weight of the base material and the weight of the contained substance(s) (in this case, the wavelength converting material(s)).

The wavelength converting material can be disposed in the wavelength converting layer 60 in any appropriate manner. For example, the wavelength converting material can be distributed evenly within the wavelength converting layer 60, or can be distributed in only a portion of the wavelength converting layer 60. The expression "distributed in a portion of the wavelength converting layer 60" includes, for example, a distribution of a wavelength converting material with its concentration higher in a portion near the upper surface 60a or the lower surface 60b in the wavelength converting layer 60. Or, in a plan view, a distribution of a wavelength converting material with its concentration higher near the center or periphery of the wavelength converting layer 60. The wavelength converting layer 60 can be formed by layering a plurality of layers, each containing a wavelength converting substance.

The wavelength converting layer 60 can also include a material other than the wavelength converting material(s). For example, a material having a refractive index different than a refractive index of the base material can be dispersed in the wavelength converting layer 60. For example, light-diffusing particles such as titanium oxide or silicon oxide can be dispersed in the base material of the wavelength converting layer 60.

Light-Diffusing Layer 70

The light-diffusing layer 70 is disposed over (in the +z direction) the wavelength converting layer 60. The light-diffusing layer 70 is configured to diffuse the light emitted from the light-emitting element(s) 50.

The light-diffusing layer 70 includes an upper surface 70a and a lower surface 70b is located on the 60 side of the wavelength converting layer of the upper surface 70a. In the present embodiment, the upper surface 70a of the light-diffusing layer 70 corresponds to the upper surface of the light source 30 and serves as the light-emitting surface 30 of the light source 30.

The light-diffusing layer 70 can have an approximately rectangular shape in a plan view. It is preferable that the light-diffusing layer 70 is larger than the light emission surface 50a of a corresponding one of the light-emitting elements 50 and entirely covers the light emission surface 50a in a plan view. The size of the light-diffusing layer 70 can be approximately the same as the size of the wavelength converting layer 60. The light source 30 tends to experience luminance unevenness: brighter regions over the light emission surface 50a of each of the light-emitting elements 50, and darker regions over the portions between the light emission surfaces 50a of adjacent two light-emitting elements 50 (in the example shown in the figures, a light-reflecting member 80 is disposed corresponding to the (darker) regions). There is also a concern that when blue light-emitting elements 50 are used in a white light emitting light source 30, the emission may be viewed as blue glow from the light emission surfaces 50a while yellow light leaking from a region between two adjacent light emission surfaces 50a (color unevenness). By arranging the light-diffusing layer 70 above the wavelength converting layer 60 (in the +z direction), the light emitted from the light emission surface 50a of the light-emitting element 50 can be diffused to suppress such luminance and color variations.

In the present embodiment, the light-diffusing layer 70 has, for example, a square shape in a plan view with a side of 305 μm. The thickness of the light-diffusing layer 70 in the z-axis direction is, for example, 30 μm.

Figure 11:
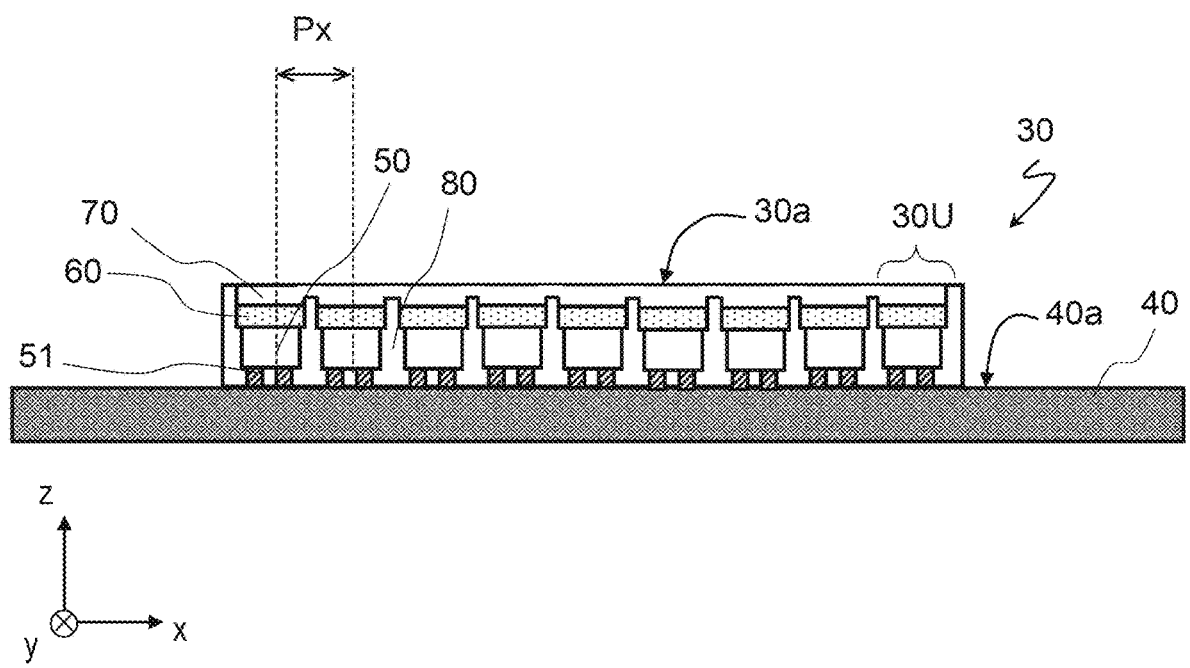
FIG. 11 is a schematic cross-sectional view illustrating another example of a light source device according to one embodiment.

In the present embodiment, the light-diffusing layer 70 is provided for each of the light-emitting elements 50, but it is possible to provide a single light-diffusing layer 70 common to the plurality of light-emitting elements 50. When a common light-diffusing layer 70 is provided for the plurality of light-emitting elements 50, the light-diffusing layer 70 may have uneven thickness in the z-axis direction. As shown in FIG. 11, for example, portions of the light-diffusing layer 70 located between the adjacent light-emitting elements 50 in a plan view may have a thickness smaller than a thickness of portions overlap with the light-emitting elements 50. In other words, it is possible to provide grooves 71 in the lower surface 70b of the light-diffusing layer 70 at locations between adjacent light-emitting elements 50. The light-diffusing layer 70 has a thickness in the z-axis direction (i.e., a thickness between the upper surface 70a to the lower surface 70b of the light-diffusing layer 70) of, for example, 30 μm, and a depth of the grooves 71 in the z-axis direction (i.e. a depth of the grooves from the lower surface 70b of the light-diffusing layer 70) is greater than 0 μm, for example, less than ⅔ of the thickness of the light-diffusing layer 70 in the z-axis direction.

The light-diffusing layer 70 contains a resin serves as a base material and a light-diffusing material dispersed in the resin. Examples of the base material include light-transmissive materials such as epoxy resin, silicone resin, resins that are mixtures of those, and glass. In view of light-resisting properties and ease of molding, it is preferable to employ silicone resin as the base material of the light-diffusing layer 70. In particular, it is preferable to use phenyl silicone resin as a main component of the base material. In addition, by using the same resin as the wavelength converting layer 60 as the base material of the light-diffusing layer 70, adhesion between the wavelength converting layer 60 and the light-diffusing layer 70 can be improved. The light-diffusing layer 70 can be made of ceramic or glass as its main material in which a light-diffusing material is contained.

The light-diffusing materials have high light reflectance, examples thereof include white fillers such as titanium oxide, silicon oxide, alumina, and zinc oxide. The content of the light-diffusing material in the light-diffusing layer 70 is preferably in a range of 0.1 to 3.0 mass %. The light-diffusing layer 70 can contain glass filler, etc., to reduce or prevent expansion and contraction caused by the heat generated in the resin of the base material. The content of glass filler in the light-diffusing layer 70 is preferably in a range of 50 to 80 mass %. Other than those, the content of the light-diffusing material, glass filler, etc. can be appropriately determined. The light-diffusing layer 70 preferably contains titanium oxide and glass filler.

Light-Reflecting Member 80

The light-reflecting member 80 is disposed on the first surface 40a of the substrate 40, and covers the first surface 40a of the substrate 40 and the lateral surfaces 50c of the plurality of light-emitting elements 50. The light-reflecting member 80 can further cover the lateral surfaces of the wavelength converting layer 60 and the lateral surfaces of the light-diffusing layer 70. In addition, the light-reflecting member 80 can be disposed covering the lateral surfaces of the electrodes 51 and filling the gap between the electrode forming surface 50b of the plurality of light-emitting elements 50 and the first surface 40a of the substrate 40. Alternatively, an underfill resin can be filled in gaps between the electrode forming surfaces 50b of the light-emitting elements 50 and the first surface 40a of the substrate 40. With the underfill resin, stress caused by a difference in the coefficient of thermal expansion between the light-emitting elements 50 and the substrate 40 can be reduced, or heat dissipation can be increased.

The light-reflecting member 80 exposes the lower surface of the electrodes 51 of each light-emitting element 50 and the upper surface 70a of each light-diffusing layer 70. The lower surfaces of the electrodes 51 are electrically connected to wirings 42 of the substrate 40, respectively. When the light-diffusing layer 70 is not provided, the upper surface 60a of the wavelength converting layer 60 can serve as the light-emitting surface 30a of the light source 30.

By arranging the light-reflecting member 80 between the light-emitting parts 30U, propagation of light between the light-emitting parts 30U can be reduced or prevented, and accordingly can reduce the uneven color. Further, when the partial drive described above is performed, the contrast between the light-emitting parts 30U in operation and the light-emitting part 30U not in operation can be improved.

In the present embodiment, the light-reflecting member 80 seals the plurality of light-emitting elements 50 and holds them together. The light-reflecting member 80 can be separately disposed corresponding to each of the light-emitting elements 50.

The light-reflecting member 80 protects the plurality of light-emitting elements 50. Also, the light-reflecting member 80 reflects the light emitted from the lateral surfaces 50c of corresponding one or more of the light-emitting elements 50 and directs the light upwards (in the +z direction) of the light-emitting element(s) 50. Further, by disposing the light-reflecting member 80 also between the electrode forming surfaces 50b of the light-emitting elements 50 and the substrate 40, the light propagating from the electrode forming surfaces 50b of the light-emitting elements 50 toward the substrate 40 can be reflected by the light-reflecting member 80 and is directed upward (in the +z direction) of the light-emitting elements 50. Accordingly, utilization efficiency of light emitted from each of one or more light-emitting elements 50 can be improved.

The light-reflecting member 80 includes, for example, a resin that serves as the base material and a light-reflecting material dispersed in the resin. Examples of the base material include light-transmissive materials such as epoxy resin, silicone resin, resins that are mixtures of those, and glass. In view of light-resisting properties and ease of molding, silicone resin is preferably employed for the base material of the light-reflecting member 80. In particular, dimethyl silicone resin or phenyl silicone resin is preferably employed as a main composition of the base material. Further, by using the same resin as the wavelength converting layer 60 and the light-diffusing layer 70 for the base material of the light-reflecting member 80, adhesion to the wavelength converting layer 60 and to the light-diffusing layer 70 can be improved.

Examples of the light-reflecting materials include titanium oxide, silicon oxide, zirconium oxide, yttrium oxide, yttria-stabilized zirconia, potassium titanate, alumina, aluminum nitride, boron nitride, and mullite. This allows for more effective reduction of light leakage in the +/−x direction, +/−y direction and −z direction of each light-emitting part 30U. The content of the light-reflecting material and other materials in the light-reflecting member 80 is preferably in a range of 10 to 70 mass %. In addition, the light-reflecting member 80 can contain glass filler, etc. to reduce or prevent expansion and contraction caused by the heat of the resin in the base material. The content of the glass filler is preferably in a range of 0 to 30 mass %, more preferably in a range of 5 to 20 mass %. Other than illustrated above, the content of the light-reflective material, glass filler, etc. can be appropriately determined. The light-reflecting member 80 preferably contains titanium oxide and glass filler.

3. Substrate 40

The light source 30 including the plurality of light-emitting elements 50 is disposed on the substrate 40. The substrate 40 includes a first surface 40a and a second surface 40b located opposite side from the first surface 40a.

In the example shown in FIG. 5C, the substrate 40 has a plate-shaped base 41, wirings 42 disposed on the first surface 40a of the base 41, and external terminals 43 disposed on the second surface 40b of the base 41. The first surface 40a of the base 41 can serve as the first surface 40a of the substrate 40, and the second surface 40b of the base 41 can serve as the second surface 40b of the substrate 40. The wirings 42 are electrically connected to the respective electrodes 51 of a corresponding one of the light-emitting elements 50. The wirings 42 are electrically connected to the external terminals 43 via, for example, beer holes and via conductors provided to the base 41.

Examples of the material of the base 41 include insulating materials such as glass epoxy, resin, and ceramics, metal member having surfaces covered by an insulating material. Of those, a ceramic that has high heat resistant property and high weather resistant property can be preferably used for the material of the base 41. Examples of the ceramics material include alumina, aluminum nitride, mullite. Such a ceramics material can be used in combination with an insulating material such as a bismaleimide triazine resin (BT resin), a glass epoxy, an epoxy-based resin, or the like.

The wirings 42 and the external terminals 43 can be made of, for example, one or more metals such as Cu, Al, Au Ag, Pt, Ti, W, Pd, Fe, and Ni, or an alloy containing one or more such metals.

The substrate 40 can be a substrate having wirings (wiring substrate), which allows for mounting of light-emitting elements such as LEDs and various electric elements. A wiring substrate can be formed with a wiring pattern, allowing for more complex wirings, which is necessary for the drive (partial drive) of the plurality of light-emitting parts 30U to emit light independently of each other.

Method of Manufacturing Lens Structure 100

One example of a method of manufacturing the lens structure 100 using a double-shot molding technique will be illustrated below with reference to the drawings.

In the present embodiment, a lens is molded as a primary molded article, and a support part is molded as a secondary molded article. In molding a lens, that is a primary molded article, a lower mold corresponding to a lower surface of the lens (hereinafter referred to as "common mold"), and an upper mold corresponding to an upper surface of the lens (hereinafter referred to as "primary mold." The common mold is used in common when molding the primary molded article and when molding the secondary molded article. In molding a support part, that is a secondary molded article, the common mold and a mold having a different shape than the primary mold (hereinafter referred to as "secondary mold").

FIG. 6A to FIG. 6E are schematic cross-sectional views, illustrating steps of a method of manufacturing the lens structure 100.

Figure 6A:
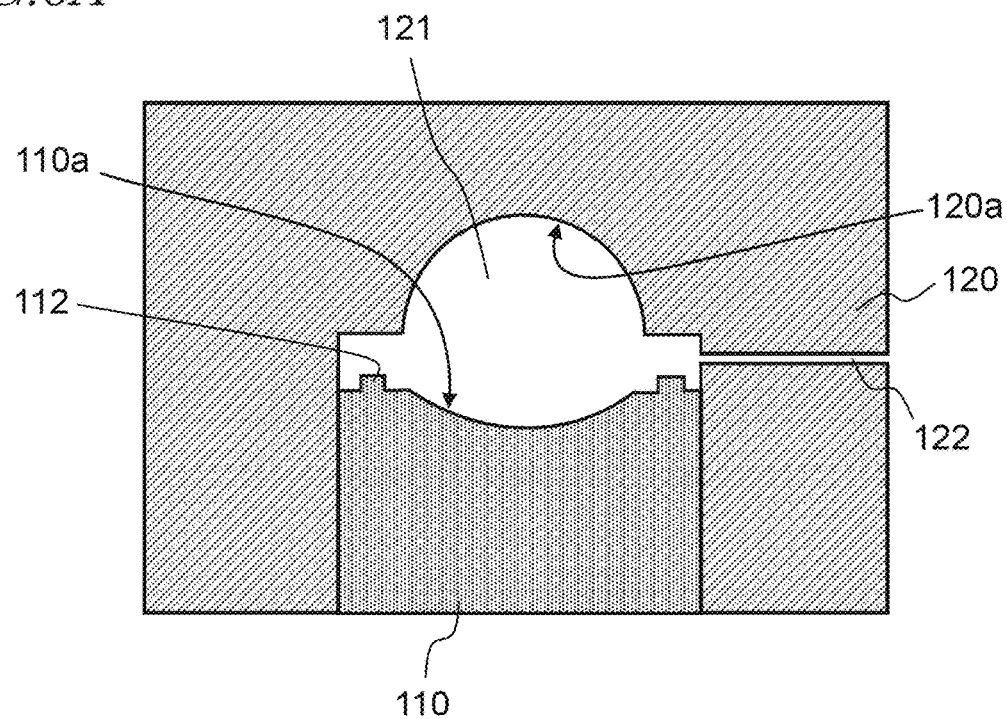
FIG. 6A is a schematic cross-sectional view illustrating a step of manufacturing a light source device according to one embodiment.

As shown in FIG. 6A, a common mold 110 having a fifth surface 110a and a primary mold 120 having a sixth surface 120a are provided.

The fifth surface 110a of the common mold 110 is the surface to form the lower surface of the lens, and the fifth surface 110a includes surfaces corresponding to the second surface of the optically functional part and the fourth surface of the flange part. The fifth surface 110a includes at least one protruding portion 112 to form the at least one first recess of the flange part. The sixth surface 120a of the primary mold 120 is the surface to form the upper surface and the lateral surfaces of the lens, and the sixth surface 120a includes surfaces corresponding to the third surface of the flange part and the outer lateral surfaces of the flange part.

The common mold 110 and the primary mold 120 are held such that the fifth surface 110a of the common mold 110 and the sixth surface 120a of the primary mold 120 are held to face each other (clamping). This forms a first cavity 121 between the common mold 110 and the primary mold 120. The first cavity 121 is the space used to form the lens that is the primary molded article.

Figure 6B:
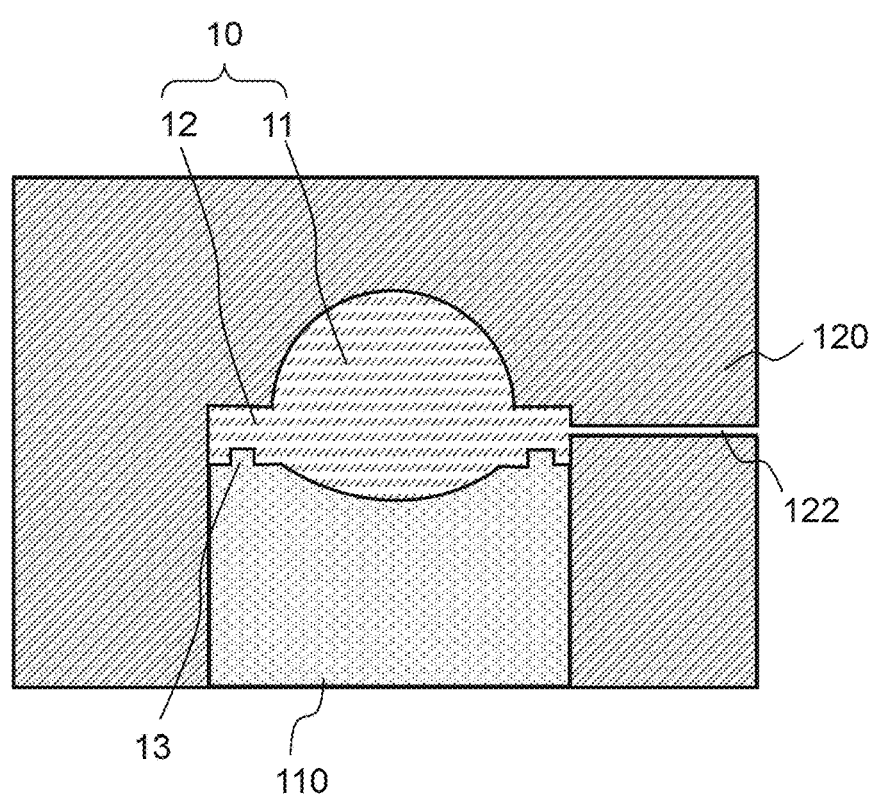
FIG. 6B is a schematic cross-sectional view illustrating a step of manufacturing a light source device according to one embodiment.

Then, as shown in FIG. 6B, the lens 10 is molded as the primary molding article (primary molding step). A first resin is injected into the first cavity 121 from a first resin injection port 122, which is formed in the primary mold 120 at a location to form the flange part of the lens. For the first resin, for example, a thermoplastic transparent resin material with polycarbonate as the base material is used. Then, the first resin in the first cavity 121 is cooled and solidified. When a thermosetting resin is used as the first resin, the first resin is cured by heating. With this, the lens 10 is formed with the first resin. The lens 10 has an optically functional part 11 and a flange part 12. On the lower surface of the flange part 12, the at least one first recess 13 corresponding to the surface shape of the at least one protruding portion 112 of the common mold 110 is formed.

Figure 6C:
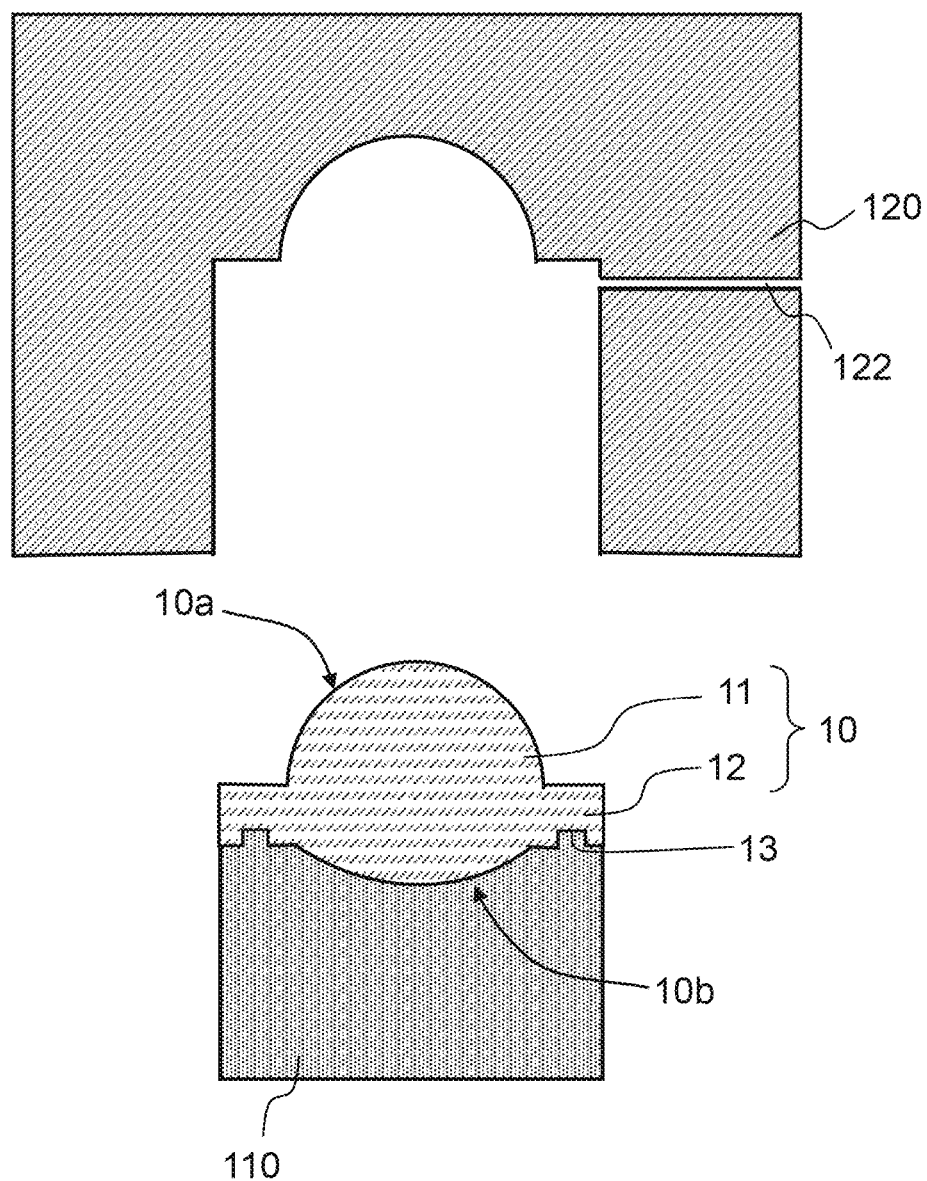
FIG. 6C is a schematic cross-sectional view illustrating a step of manufacturing a light source device according to one embodiment.

A step of first mold opening process is then performed by moving one of the common mold 110 and primary mold 120 away from the other, as shown in FIG. 6C. In this case, as illustrated, the lens 10 that is the primary molded article is demolded from the primary mold 120 and remains on the common mold 110. In the present embodiment, because the at least one first recess 13 is formed in the lower surface 10b of the lens 10, a contact area between the lower surface 10b of the lens 10 and the fifth surface 110a of the common mold 110 is greater, compared to a case in which the at least one first recess 13 is not provided in the lower surface 10b of the lens 10, allowing higher adhesion between the lens 10 and the common mold 110. Therefore, the lens 10 can be demolded from the primary mold 120 while the lens 10 is held on the common mold 110.

Figure 6D:
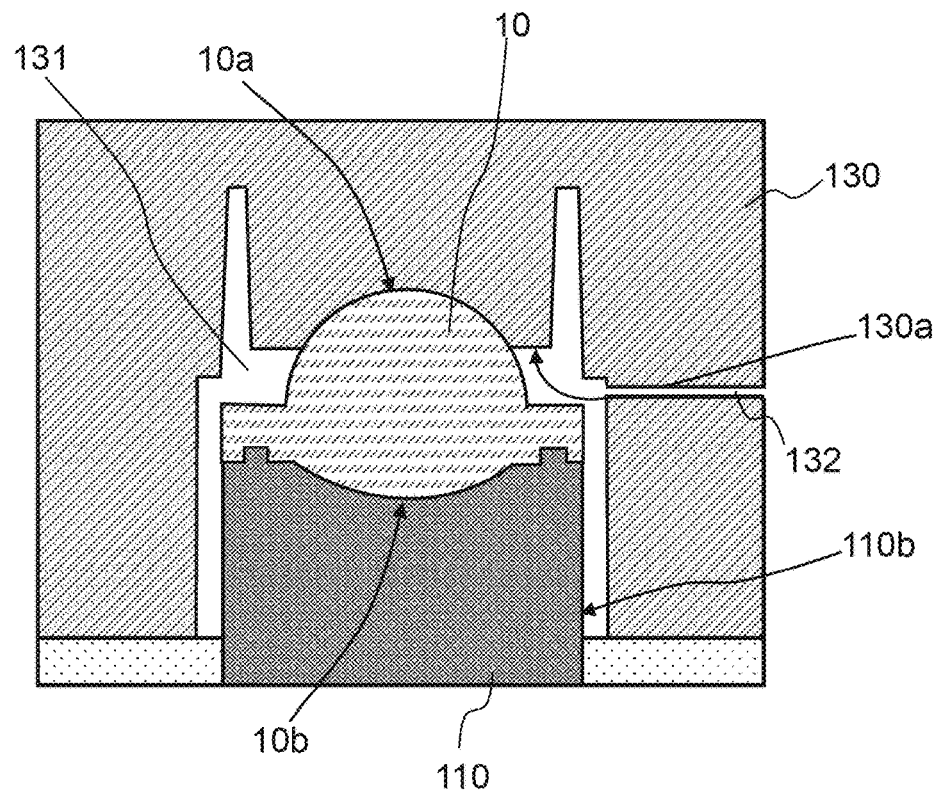
FIG. 6D is a schematic cross-sectional view illustrating a step of manufacturing a light source device according to one embodiment.

Then, as shown in FIG. 6D, a secondary mold 130 having a seventh surface 130a is provided. The secondary mold 130 is placed on the common mold 110, which holds the lens 10, and the mold is clamped. This creates a second cavity 131 between the common mold 110, the lens 10, and the secondary mold 130. The second cavity 131 is the space used to form the support part that is the secondary molded article. A portion of the upper surface 10a of the lens 10 is in contact with a seventh surface 130a of the secondary mold 130. In the example shown in the figure, the space between the edge portion of the first surface 11a of the optically functional part 11 of the lens 10, the third surface 12a and the outer lateral surfaces 12c of the flange part 12, the seventh surface 130a of the secondary mold 130, and the lateral surfaces 110b of the common mold 110 create the second cavity 131.

Figure 6E:
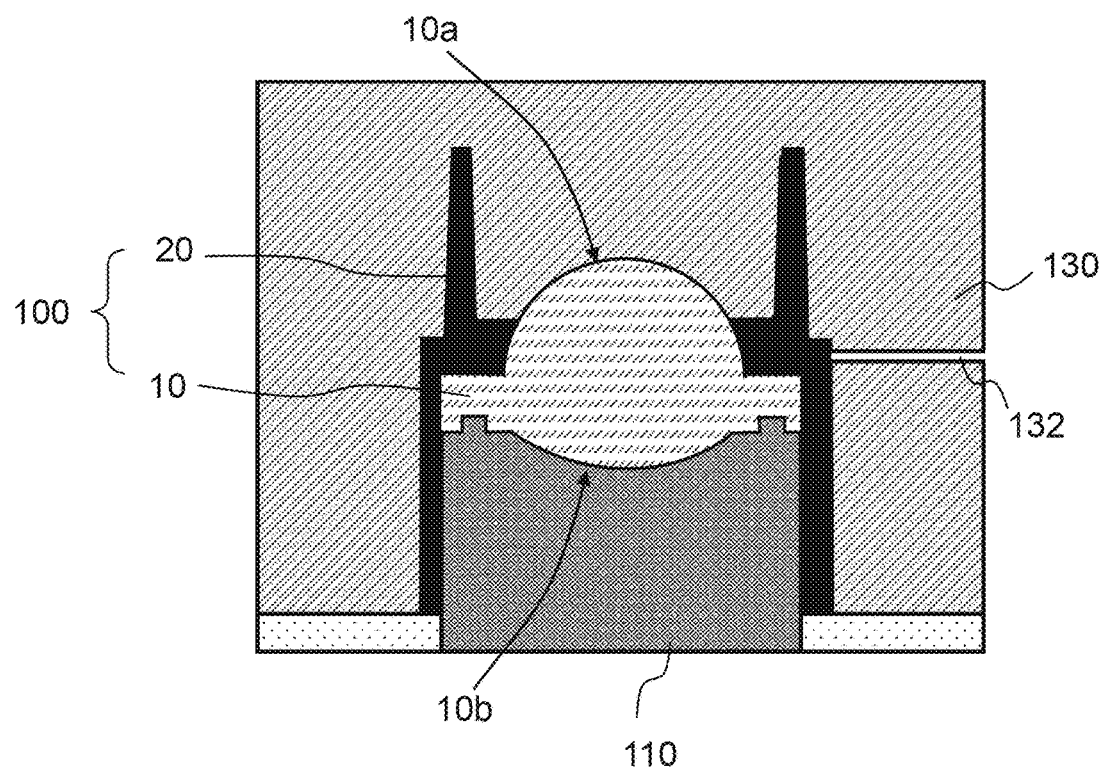
FIG. 6E is a schematic cross-sectional view illustrating a step of manufacturing a light source device according to one embodiment.

Subsequently, as shown in FIG. 6E, the support part 20 is molded as the secondary molded article (a step of secondary molding). A second resin is injected into the second cavity 131 from a second resin injection port 132, which is formed in the secondary mold 130 at a location to form the first flange portion of the support part 20. For the second resin, for example, a dark-colored thermoplastic resin material is used as the second resin. Then, the second resin in the second cavity 131 is cooled and solidified. When a thermosetting resin is used as the second resin, the second resin is cured by heating. With this, the support part 20 is formed with the second resin. The support part 20 and the lens 10 are solidly joined by the contacting of the support part 20 with the edge portion of the first surface 11a of the optically functional part 11 of the lens 10, the third surface 12a and the outer lateral surfaces 12c of the flange part 12. As described above, the lens structure 100 can be obtained. In FIG. 6D and FIG. 6E, the second resin injection port 132 is formed in the secondary mold 130 at the location to form the first flange portion of the support part 20, but the second resin injection port 132 can be formed at an appropriate location. For example, the second resin injection port 132 can be formed in the secondary mold 130 at a location to form the second hood portion.

The support part 20 is in contact with at least a portion of the upper surface 10a of the lens 10. As shown in the figure, the support part 20 can cover the outer lateral surfaces of the lens 10 (i.e. the outer lateral surfaces 12c of the flange part 12). In the present embodiment, the support part 20 is molded while the lower surface 10b of the lens 10 is in contact with the common mold 110, such that the support part 20 and the lower surface 10b of the lens 10 are not in contact with each other.

Subsequently, the secondary mold 130 and the common mold 110 is opened (hereinafter referred to as "a step of second mold opening"). Thus, the lens structure 100 is separated from the secondary mold 130 while held on the common mold 110. The lens structure 100 is then removed from the common mold 110 by demolding the lens structure 100 from the common mold 110. In the present embodiment, as described above, the first hood portion 21 and the second hood portion 22 of the support part 20 inclined toward the optical axis of the lens 10 along the +z direction, and the first hood portion 21 has a tapered shape in the +z direction, which can facilitate opening of the secondary mold 130 and the common mold 110.

In the present embodiment, after the lens 10 is molded as the primary molded article, the support part 20 is molded as the secondary molded article. If the support part 20 is molded (the support part 20 is the primary molded article) before molding the lens 10 (the lens 10 is the secondary molded article), because of the presence of the support part 20, the resin material of the lens cannot be injected from the lateral surface of the mold. If the resin material is injected from a location other than a lateral surface of the mold, the resin injection port is needed to be located in a region of the optically functional part 11 of the lens 10, which may affect the optical action of the optically functional part 11. Therefore, it is preferable to form lens 10 in the step of primary molding and to form the support part 20 in the step of secondary molding.

When manufacturing a lens structure using a conventional double-shot molding technique, if a contact area between the upper surface of the lens and the upper mold is greater than a contact area between the lower surface of the lens and the lower mold, the lower surface of the lens may be separated from the lower mold, resulting in the lens retained in the upper mold. In contrast, according to the present embodiment, forming the at least one first recess 13 in the lower surface 10b of the lend 10 increase a contact area between the lens 10 and the common mold 110, such that adhesion between the lower surface 10b of the lens 10 and the fifth surface 110a of the common mold 110 can be improved. Therefore, occurrence of retention of the molded product in the primary mold in the step of first mold opening can be reduced or prevented, and the primary mold 120 and lens 10 can be more easily separated. As a result, the support part 20 that is the secondary molded article, can be molded continuously on the lens 10 after the step of first mold opening. According to the present embodiment, the molding of the lens structure 100 does not require the use of complex molds, and with the use of only three types of molds: common mold 110, primary mold 120, and secondary mold 130, occurrence of retention of the molded article in a mold can be reduced or prevented.

The adhesion between the lens 10 and the common mold 110 can be adjusted by the contact area between the lower surface 10b of the lens 10 and the fifth surface 110a of the common mold 110, and in addition thereto, the shape of the at least one first recess 13 in a plan view, the inclination angles of the lateral surfaces defining the at least one first recess 13, the location and the number of the first recesses, etc.

Variational Examples

Variational examples of the lens according to the present disclosure will be described below. Each of the lenses of the variational examples is formed with a protrusion or a second recess in a lateral surface defining each of the first recesses, which differs from the lens shown in FIG. 3A and FIG. 3B. In the description below, differences from the first recess shown in FIG. 3A and FIG. 3B will be mainly illustrated, and repetitive description of the similar structure will be appropriately omitted. In each drawing showing variational examples, components similar to those shown in FIG. 3A and FIG. 3B are indicated with the same reference characters for clarity.

In Variational Examples 1 to 4, the first recess defined in a circular groove in a plan view will be illustrated. But other than a circular shape, the shape of to the first recess in a plan view can be appropriately defined.

Figure 7A:
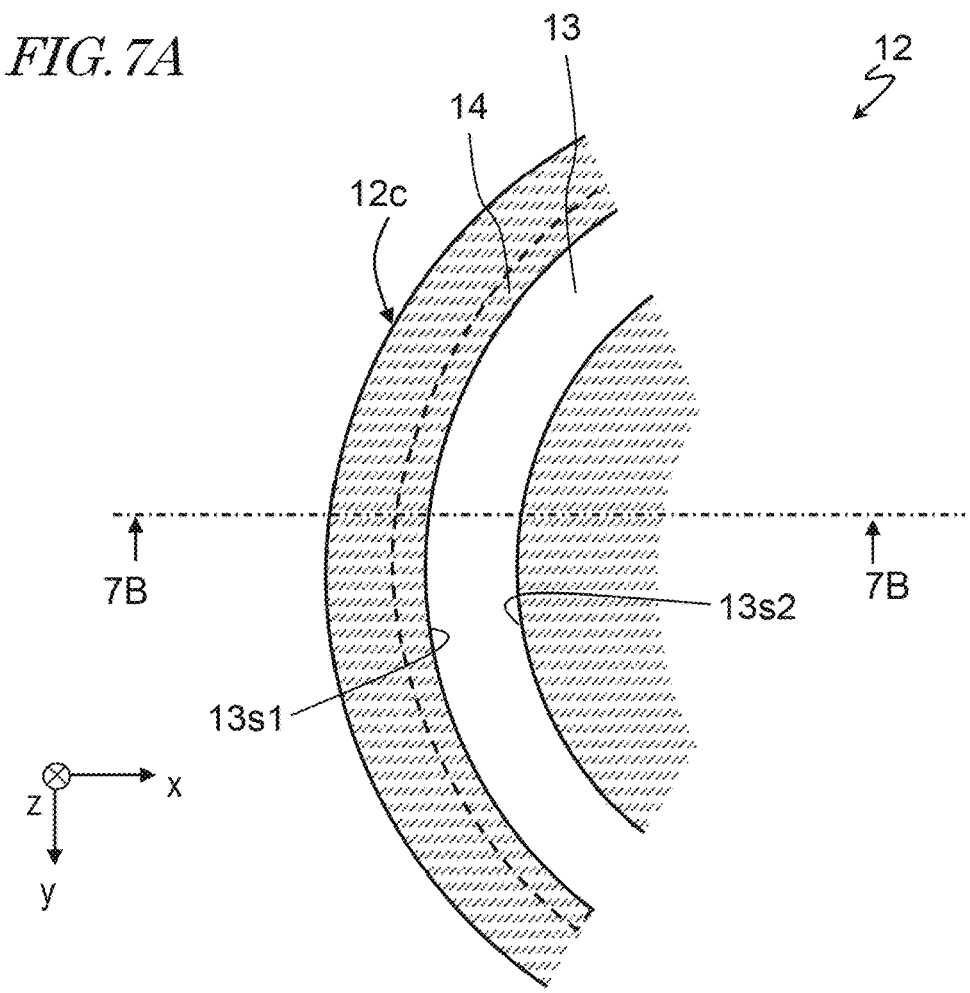
FIG. 7A is an enlarged schematic cross-sectional view of a portion of a lens according to Variational Example 1.
Figure 7B:
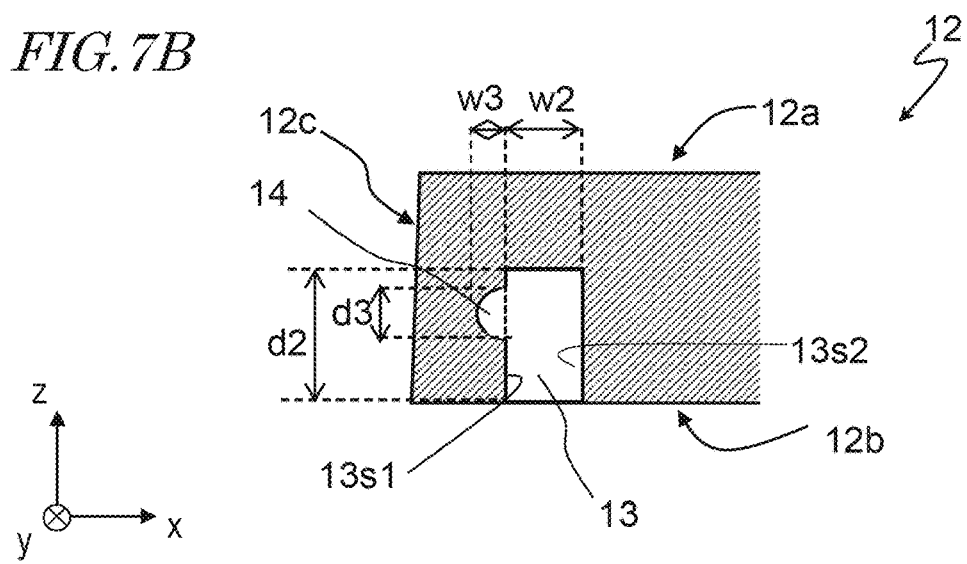
FIG. 7B is an enlarged schematic cross-sectional view taken along line 7B-7B of FIG. 7A.
Figure 8A:
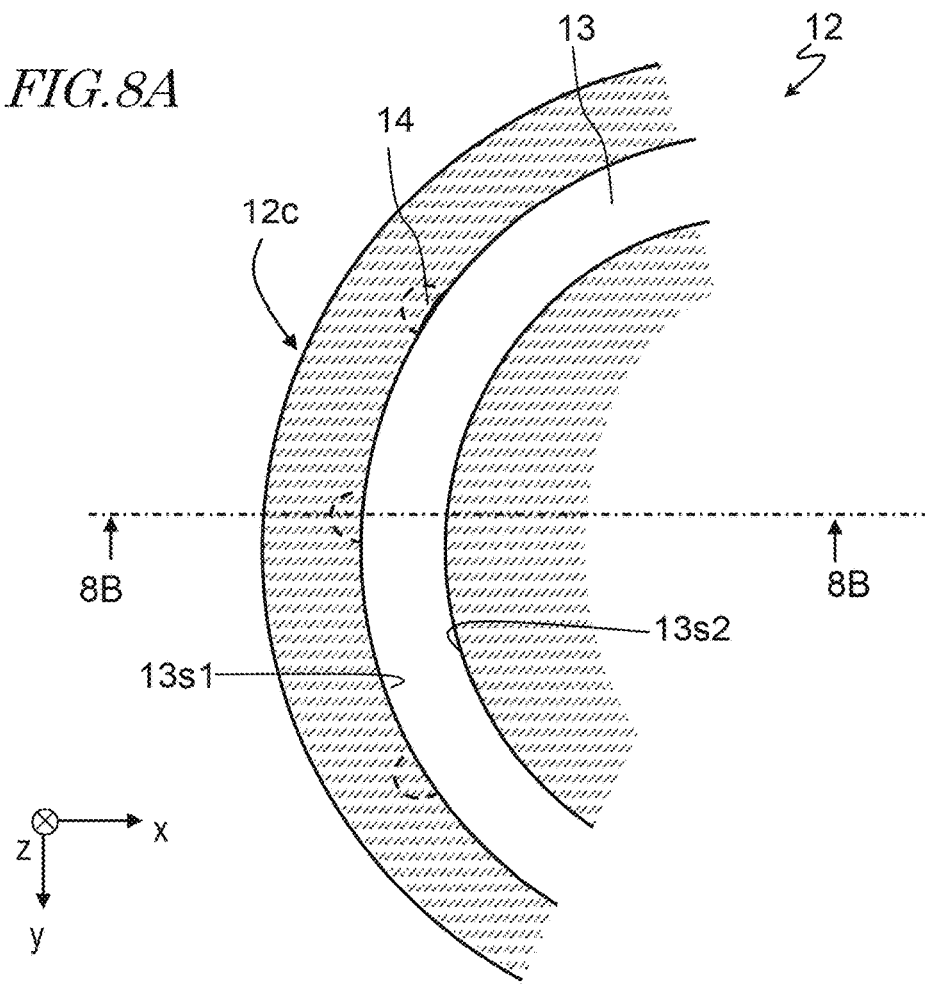
FIG. 8A is an enlarged schematic cross-sectional view of a portion of a lens according to Variational Example 2.
Figure 8B:
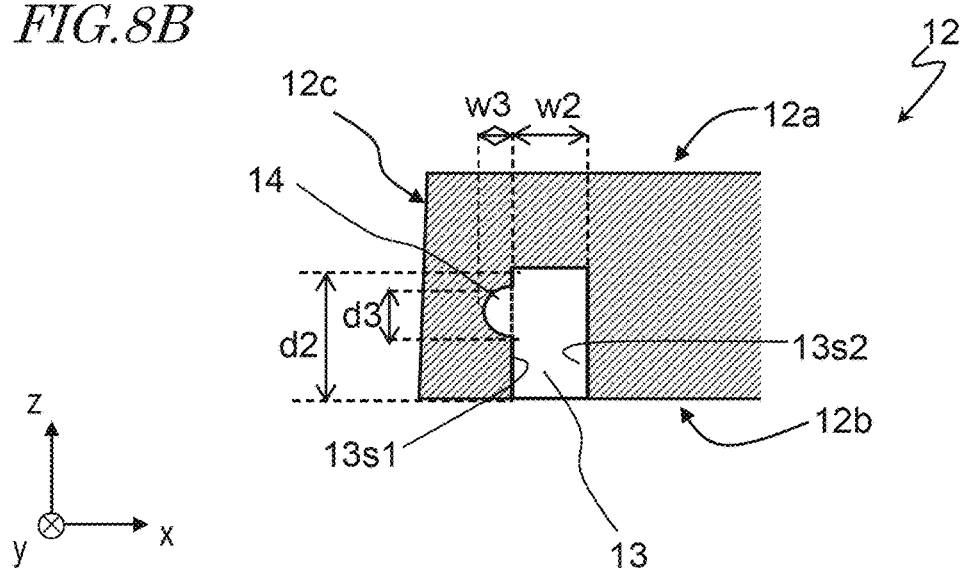
FIG. 8B is an enlarged schematic cross-sectional view taken along line 8B-8B of FIG. 8A.

FIG. 7A is a schematic enlarged plan view of a portion of the flange part 12 of the lens 10 of Variational Example 1, and FIG. 7B is a schematic enlarged cross-sectional view taken along line 7B-7B of FIG. 7A. FIG. 8A is a schematic enlarged view of a portion of the flange part 12 of the lens 10 of Variational Example 2, and FIG. 8B is a schematic enlarged cross-sectional view taken along line 8B-8B of FIG. 8A.

As shown in the figures, the lateral surfaces defining the first recess 13 include a first lateral surface 13s1 along the outer periphery of the optically functional part, and a second lateral surface 13s2 facing the first lateral surface 13s1 and is located closer to the optically functional part than the first lateral surface 13s1 to the optically functional part.

In Variational Example 1, the first recess 13 is formed with one second recess 14 formed in the first lateral surface 13s1 and extending along the first lateral surface 13s1. Providing the second recess 14 allows for more effective adhesion between the lower surface of lens 10 and the common mold during the step of first mold opening. The second recess 14 can, for example, extend along the entire length of the first lateral surface 13s1, to surround the optically functional part in a plan view. The formation of the second recess 14 along the entire circumference of the first lateral surface 13s1 can facilitate efficient reduction or prevention of the occurrence of retention of the lens 10.

In Variational Example 2, a plurality of second recesses 14 are formed in the first lateral surface 13s1. The plurality of second recess 14 are arranged spaced apart from each other in a plan view. For example, as shown in Variational Example 1, when one circular ring-shaped second recess 14 extending along the first lateral surface 13s1 in a plan view is formed in the first lateral surface 13s1, an excess degree of adhesion may result between the lower surface of the lens 10 and the common mold depending on the material(s) of the lens 10. In such a case, the degree of adhesion can be adjusted by selecting the size, the number, and the arrangement pitch of the second recesses 14. This allows easy separation of the lens structure 100 from the common mold 110 after the step of second molding, while reducing or preventing the occurrence of retention in the mold in the step of first mold opening.

In Variational Example 1 and Variational Example 2, the depth of the second recesses 14 (i.e., a maximum width in the x-y plane) w3 is, for example, preferably in a range of ⅓ to ½ of the width w2 of the first recess 13, for example, 0.1 mm. The length d3 of the second recess 14 in the z-axis direction is, for example, in a range of ⅓ to ⅔ of the depth d2 of the first recess 13, for example, 0.2 mm.

Figure 9A:
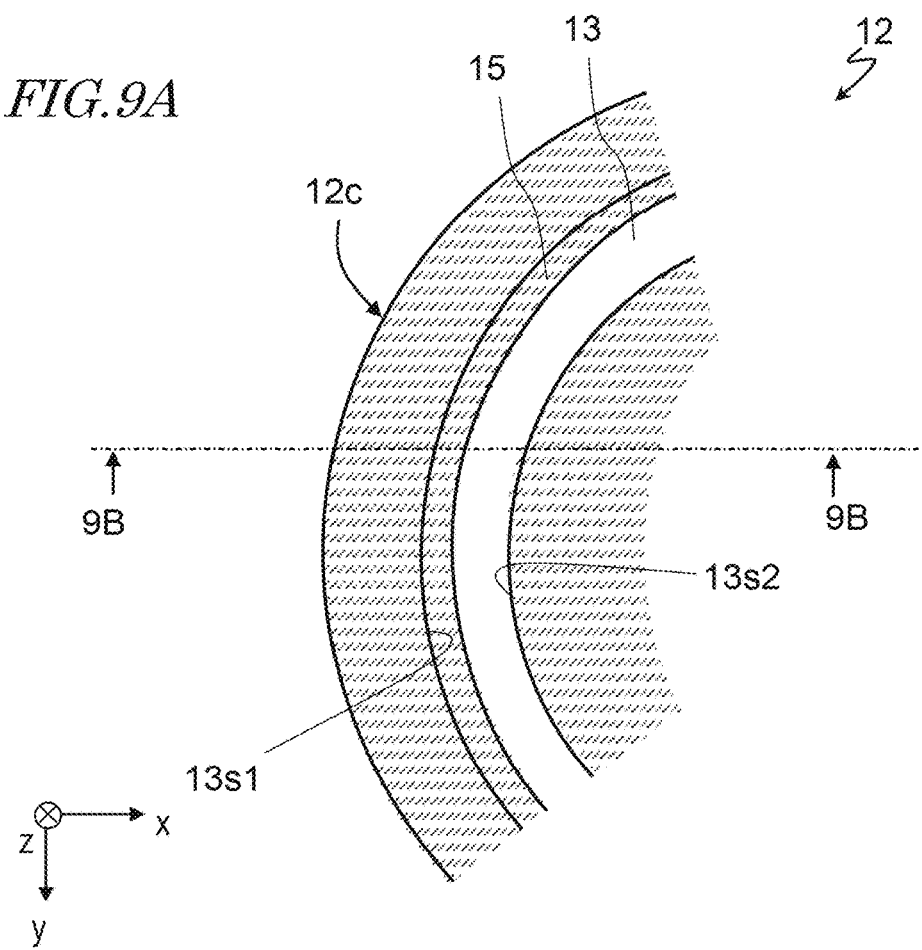
FIG. 9A is an enlarged schematic cross-sectional view of a portion of a lens according to Variational Example 3.
Figure 9B:
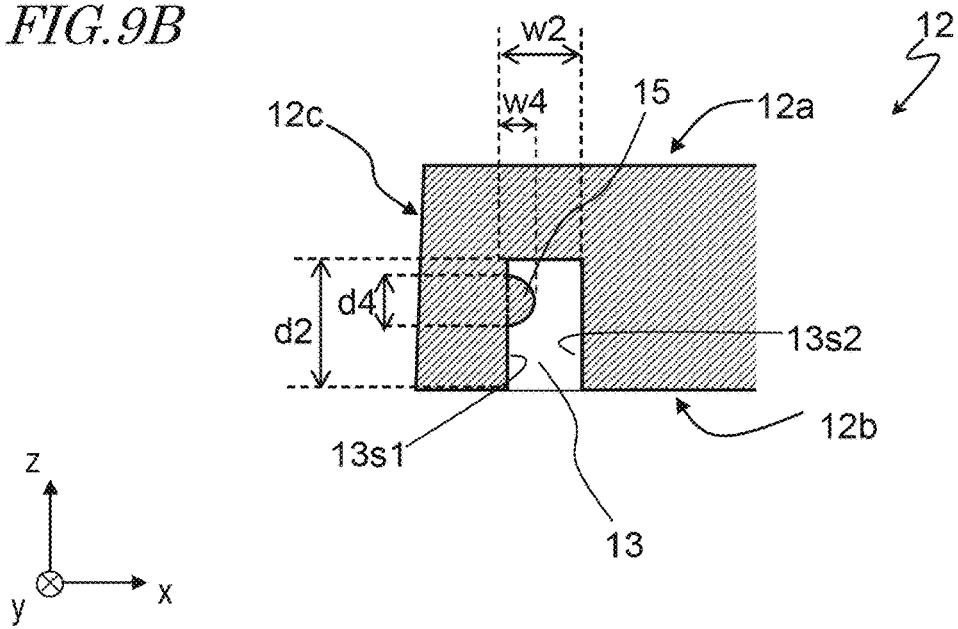
FIG. 9B is an enlarged schematic cross-sectional view taken along line 9B-9B of FIG. 9A.
Figure 10A:
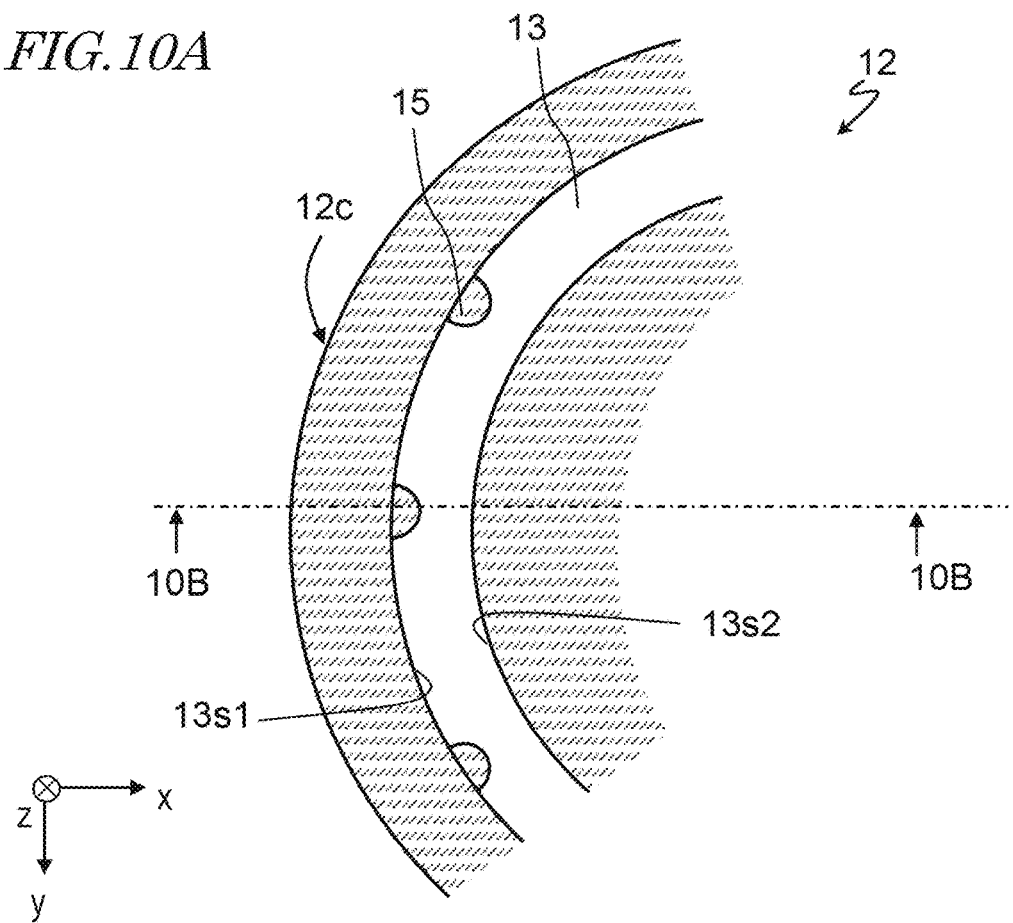
FIG. 10A an enlarged schematic cross-sectional view of a portion of a lens according to Variational Example 4.
Figure 10B:
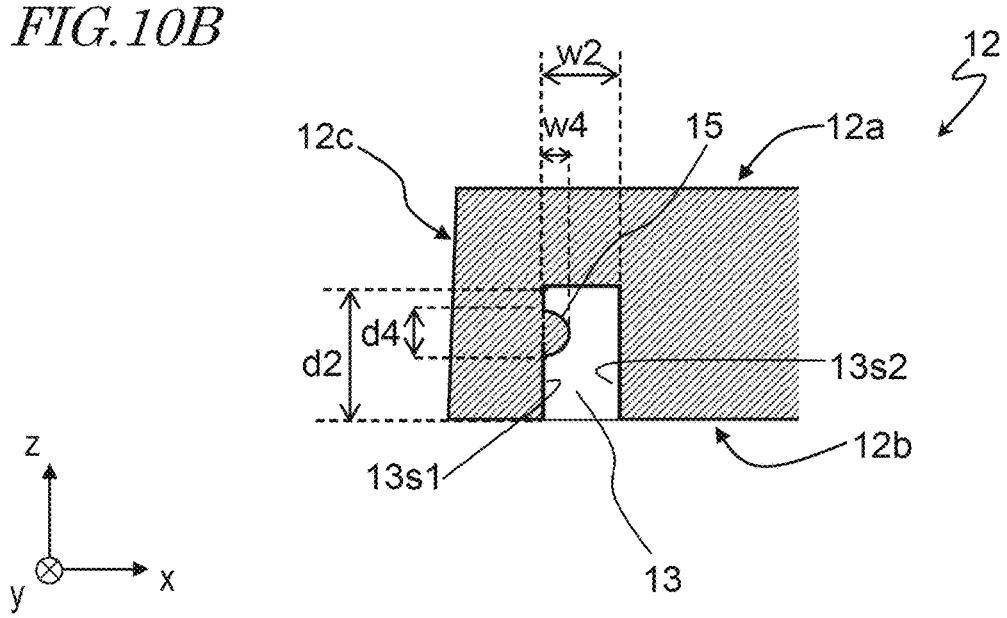
FIG. 10B is an enlarged schematic cross-sectional view taken along line 10B-10B of FIG. 10A.

FIG. 9A is a schematic enlarged plan view of a portion of the flange part 12 of the lens 10 of Variational Example 3, and FIG. 9B is a schematic enlarged cross-sectional view taken along line 9B-9B of FIG. 9A. FIG. 10A is a schematic enlarged plan view of a portion of the flange part 12 of the lens 10 of Variational Example 4, and FIG. 10B is a schematic enlarged cross-sectional view taken along line 10B-10B of FIG. 10A.

In Variational Example 3, the first recess 13 is formed with a protrusion 15 extending along the first lateral surface 13s1. This makes it possible to more efficiently increase the adhesion between the lower surface of the lens 10 and the common mold during the step of mold opening. The protrusion 15 can be, for example, extended along the entire length of the first lateral surface 13s1 surrounding the optically functional part in a plan view. Forming the protrusion 15 along the entire circumference of the first lateral surface 13s1 can be more effective in reducing or preventing occurrence of retention in the mold.

In Variational Example 4, the first recess 13 is formed with a plurality of protrusions 15 on the first lateral surface 13s1. The plurality of protrusions 15 are arranged spaced apart from one another in a plan view. For example, as shown in Variational Example 3, when one circular protrusion 15 extending along the first lateral surface 13s1 in a plan view is formed on the first lateral surface 13s1, an excess degree of adhesion between the lower surface of the lens 10 and the common mold may results depending on the material(s) of the lens 10. In such a case, the degree of adhesion between the lower surface of the lens 10 and the common mold can be adjusted by selecting the size, the number, and the arrangement pitch etc., of the protrusion 15. This allows easy separation of the lens structure 100 from the common mold 110 after the step of second molding, while reducing or preventing occurrence of retention in the mold in the step of first mold opening.

In Variational Example 3 and Variational Example 4, the height of the protrusion 15 (i.e. the maximum width in the x-y plane) w4 is, for example, preferably in a range of ⅓ to ½ of the width w2 of the first recess 13, e.g. 0.1 mm. The length d4 of the protrusion 15 in the z-axis direction is, for example, preferably in a range of ⅓ to ⅔ of the depth d2 of the first recess 13, for example 0.2 mm.

The second recess 14 or the protrusion 15 preferably has a rounded shape in a cross-sectional view. With this arrangement, demolding of the double-shot molded article (lens structure 100) from the common mold after the step of secondary molding can be facilitated. As a result, occurrence of deformation or the like of the secondary molded article in demolding can be reduced or prevented.

Other than that illustrated in the figures, the size, number, and shape of the second recess 14 or the protrusion 15 formed in the first recess 13 can be appropriately determined. The cross-sectional shape of the second recess 14 and the protrusion 15 in the x-y plane can be a rectangular shape. Both the protrusion and the second recess can be formed in a single first recess 13.

In Variational Example 1 to 4, the one or more second recesses 14 or the one or more protrusions 15 are formed in or on the first lateral surface 13s1 that is located farther from the optically functional part 11 of the first lateral surface 13s1 and the second lateral surface 13s2 of the first recess 13. This arrangement can further reliably reduce or prevent the effect of the second recess 14 or the protrusion 15 on the optical action of the optically functional part 11.

It is also desirable that the one or more second recesses 14 or the one or more protrusions 15 are located on the first lateral surface 13s1 of the first recess 13. In the present embodiment, forming the one or more first recesses 13 in the flange part 12 allows a portion of the flange part 12 located closer to the outer lateral surface than the first recess 13 to the outer lateral surface easily deform by external forces or the like. In more details, after the step of secondary molding, when the lens structure 100 is removed from the common mold, the part of the flange part 12 by warping the lens structure 100, portions of the flange part 12 located closer to the optically functional part 11 than the first recess 13 to the optically functional part 11 are difficult to deform because being located adjacent to the optically functional part 11, but the portions of the flange part 12 described above have room for deformation (i.e., space), which makes them more easily deformed. Therefore, forming the one or more second recesses 14 or one or more protrusions 15 in or on the first lateral surface 13s1 of the one or more first recesses 13 respectively, that is, forming the one or more second recesses 14 or one or more protrusions at portions of the flange part 12 that are more easily deformed, the lens structure 100 obtained after the step of secondary molding can be demolded easily than the one or more second recesses 14 or one or more protrusions are arranged in or on the second lateral surface 13s2.

Note that the one or more second recesses 14 or the one or more protrusions 15 can be located on the second lateral surface 13s2 of the first recess 13. In such a case, the one or more second recesses 14 or the one or more protrusions 15 are preferably formed not to be overlapped with the optically functional part 11 in a plan view. With this arrangement, the effect on the optical action of the optically functional part 11 can be reduced or prevented.

When a plurality of second recesses 14 or a plurality of protrusions 15 are formed in or on a single first recess 13, some of the second recesses 14 or some of the protrusions 15 can be formed in or on the first lateral surface 13s1 of the first recess 13, while some of the second recesses 14 or some of the protrusions 15 may be formed in or on the second lateral surface 13s2 of the first recess 13.

The light source devices and the lens structures of the present disclosure can be used suitably to the light source devices in various applications, for example, lighting, camera flash lights, vehicular headlights, etc. In particular, the light source devices and the lens structures of the present disclosure can be used suitably for flash lights of small cameras mounted on mobile phones and other devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light source device comprising:
   a light source having an upper surface including a light-emitting surface, the light source comprising a plurality of light-emitting parts arranged in a two-dimensional array;
   a lens located above and spaced apart from the light-emitting surface of the light source, wherein the lens comprises an optically functional part, and a flange part located along an outer periphery of the optically functional part; and
   a support part formed of a light-shielding member and configured to support at least the flange part of the lens; wherein:
   the optically functional part comprises:
     a first surface located at a side facing away from the light source, and
     a second surface located at a side opposite the first surface and facing the light source, wherein:
     an open space is located between the light-emitting surface of the light source and the second surface of the optically functional part,
     a surface area of the first surface is greater than a surface area of the second surface, and
     in a plan view, the first surface and the second surface overlap the plurality of light-emitting parts; and
   the flange part comprises:
     a third surface located at a same side as the first surface, and
     a fourth surface located at a same side as the second surface, wherein:
     the flange part defines at least one first recess in the fourth surface, and
     the at least one first recess is continuous with the open space.

2. The light source device according to claim 1, wherein the lens is a convex lens in which the first surface and the second surface are convex surfaces.

3. The light source device according to claim 2, wherein a radius of curvature of the first surface is smaller than a radius of curvature of the second surface.

4. The light source device according to claim 3, wherein the radius of curvature of the first surface is in a range of 1.5 to 3.0 mm and the radius of curvature of the second surface is in a range of 5.0 to 30.0 mm.

5. The light source device according to claim 1, wherein:
the first surface of the optically functional part is on an upper side of the lens;
the second surface of the optically functional part is on a lower side of the lens;
the flange part includes an outer lateral surface connected to the third surface and the fourth surface;
the support part comprises:
a first hood portion extending upward from the third surface of the flange part,
a second hood portion contacting the outer lateral surface of the flange part and extending downward; and
in a plan view, the at least one first recess overlaps the first hood portion and is located inward of the second hood portion.

6. The light source device according to claim 5, further comprising:
a substrate;
wherein the light source is disposed on a first surface of the substrate, and the second hood portion is secured to the substrate.

7. The light source device according to claim 5, wherein:
the lens has a single optical axis with respect to the light-emitting surface;
the first hood portion has a wall thickness that is tapered upward; and
the second hood portion is tilted toward the single optical axis of the lens and upward.

8. The light source device according to claim 1, wherein:
the at least one first recess of the flange part is defined by a base and lateral surfaces, the lateral surfaces includes two lateral surfaces facing each other and formed along the outer periphery of the optically functional part; and
at least one protrusion and/or at least one second recess is formed on or in at least one of the two lateral surfaces.

9. The light source device according to claim 8, wherein:
the lateral surfaces of the at least one first recess comprise a first lateral surface formed along the outer periphery of the optically functional part, and a second lateral surface facing the first lateral surface and formed inward along the outer periphery of the optically functional part; and
the at least one protrusion and/or at least one second recess is formed on or in the first lateral surface.

10. The light source device according to claim 1, wherein the support part covers an end portion of the first surface of the optically functional part.

11. The light source device according to claim 10, wherein a portion of the first surface of the lens that is not covered by the support part has a surface area 2.5 to 4.5 times greater than a surface area of the light-emitting surface of the light source.

12. The light source device according to claim 1, wherein:
the support part has a contact surface that is in contact with at least a portion of the third surface of the flange part; and
in a plan view, the contact surface of the support part and the at least one first recess of the flange part overlap each other.

13. The light source device according to claim 1, wherein, in a plan view, the at least one first recess of the flange part comprises a groove surrounding the optically functional part.

14. The light source device according to claim 1, wherein the at least one first recess of the flange part comprises a plurality of recesses spaced apart from one another.

15. The light source device according to claim 1, wherein the support part and the lens are molded in one body through double-shot molding.

16. The light source device according to claim 1, wherein the support part is not in contact with a portion of the flange part defining the at least one first recess.

17. The light source device according to claim 1, wherein the lens has a single optical axis with respect to the light-emitting surface.

18. The light source device according to claim 1, wherein the plurality of light-emitting parts are independently operatable.

19. The light source device according to claim 1, wherein the light source comprises:
a plurality of light emitting elements arranged in a two dimensional array, at least one of the plurality of light emitting elements being included in each of the plurality of light emitting parts, and
a wavelength converting layer covering a light-emitting surface of each of the plurality of light emitting elements.

20. A lens structure comprising:
a lens comprising an optically functional part, and a flange part located along an outer periphery of the optically functional part; and
a support part formed of a light-shielding member and configured to support at least the flange part of the lens; wherein:
the lens and the support part are molded in one body through double-shot molding;
the optically functional part includes a first surface on an upper side of the lens and a second surface located on a lower side of the lens;
a surface area of the first surface is greater than a surface area of the second surface;
the flange part has a third surface located on a same side as the first surface, and a fourth surface located on a same side as the second surface; and
the flange part defines at least one first recess in the fourth surface, wherein:
the flange part includes an outer lateral surface connected to the third surface and the fourth surface, and
the support part comprises:
a first hood portion extending upward from the third surface of the flange part, and
a second hood portion contacting the outer lateral surface of the flange part and extending downward.

21. The lens structure according to claim 20, wherein:
the support part has a contact surface that is in contact with at least a portion of the third surface of the flange part; and
the contact surface of the support part and the at least one first recess of the flange part are overlapped each other in a plan view.

22. The lens structure according to claim 20, wherein, in a plan view, the first hood portion is located inward of the second hood portion.

23. The lens structure according to claim 20, wherein the lens is a convex lens in which the first surface and the second surface are convex surfaces.

24. The lens structure according to claim 20, wherein:
the lens has a single optical axis;
the first hood portion has a wall thickness that is tapered upward; and the second hood portion is tilted toward the single optical axis of the lens and upward.

25. The light source device according to claim 5, wherein, in a plan view, the first hood portion is located inward of the second hood portion.

* * * * *